United States Patent [19]

Sumi

[11] Patent Number: 5,729,179
[45] Date of Patent: Mar. 17, 1998

[54] VARIABLE FREQUENCY DIVIDER

[75] Inventor: Yasuaki Sumi, Tottori, Japan

[73] Assignees: Sanyo Electric Co., Ltd., Moriguchi; Tottori Sanyo Electric Co., Ltd., Tottori-ken, both of Japan

[21] Appl. No.: 718,000

[22] Filed: Sep. 26, 1996

[30] Foreign Application Priority Data

| Sep. 28, 1995 | [JP] | Japan | 7-251453 |
| Nov. 22, 1995 | [JP] | Japan | 7-304341 |
| Jan. 9, 1996 | [JP] | Japan | 8-001644 |
| Jan. 12, 1996 | [JP] | Japan | 8-004215 |
| Jan. 17, 1996 | [JP] | Japan | 8-005769 |

[51] Int. Cl.[6] .................... H03L 7/087; H03L 7/18; H03K 21/00
[52] U.S. Cl. ............... 331/12; 331/1 A; 331/16; 331/25; 327/115; 327/117; 377/48
[58] Field of Search .................. 331/1 A, 11, 12, 331/16, 25; 327/115, 117, 118; 377/47, 48

[56] References Cited

U.S. PATENT DOCUMENTS

| 3,967,205 | 6/1976 | Rossi | 328/46 |
| 4,573,176 | 2/1986 | Yeager | 377/48 |
| 4,888,564 | 12/1989 | Ishigaki | 331/1 A |
| 4,935,944 | 6/1990 | Everett | 377/48 |
| 5,063,579 | 11/1991 | Sasaki | 377/48 |
| 5,144,254 | 9/1992 | Wilke | 331/2 X |
| 5,528,181 | 6/1996 | Suggs | 327/115 |

FOREIGN PATENT DOCUMENTS

| 0 566 274 A1 | 10/1993 | European Pat. Off. . |
| 51-49540 | 12/1976 | Japan . |
| 59-31060 | 9/1984 | Japan . |
| 62-30352 | 8/1987 | Japan . |
| WO90/07232 | 6/1990 | WIPO . |

OTHER PUBLICATIONS

Philips Semiconductor Application Note, SCO/AN92002J, Frequecny Synthesizer, UMA 1005 Designer's Guide, Ken Maison (translated Nov. 5, 1992, pp. 1, 2, 7 and 8).

Primary Examiner—David Mis
Attorney, Agent, or Firm—Panitch Schwarze Jacobs & Nadel, P.C.

[57] ABSTRACT

In a variable frequency divider capable of N+½ frequency division, a programmable frequency divider alternately frequency-divides an input signal by a frequency division ratio N (N being an integer) or by a frequency division ratio N+1. A first signal generating circuit generates a first signal in synchronism with an output signal of the programmable frequency division circuit. A second signal generating circuit generates a second signal which is identical to the first signal but delayed by half a period of the input signal. An output circuit alternately selects the first and second signals, and outputs the selected signal as frequency-divided signal. A delay circuit outputs a delayed signal identical to the first signal but delayed by one period of the input signal. A preset signal generating circuit alternately selects the delayed signal and the first signal, and presets the programmable frequency division circuit with the selected signal. The programmable frequency divider used may operate at the same speed as in N frequency division.

17 Claims, 31 Drawing Sheets

FIG. 23

DIVISION BY 2/5

|  | PRIOR ART | | INVENTION | |
| --- | --- | --- | --- | --- |
|  | DIVISION RATIO | ERROR | DIVISION RATIO | ERROR |
| 1st TIME | N | 2/5 | N+1/2 | 4/10 |
| 2nd TIME | N+1 | 4/5 | N+1/2 | 3/10 |
| 3rd TIME | N | 1/5 | N | 2/10 |
| 4th TIME | N+1 | 3/5 | N+1/2 | 1/10 |
| 5th TIME | N | 0 | N+1/2 | 0 |
| TOTAL | 5N+2 | 10/5 | 5N+2 | 10/10 |
| AVERAGE | N+2/5 | 2/5 | N+2/5 | 2/10 |

FIG. 35

DIVISION BY 2/5 (PRIOR ART)

| | DIVISION RATIO | ACCUMULATOR | ERROR |
|---|---|---|---|
| 1st TIME | N' | 2 | 2/5 |
| 2nd TIME | N' | 4 (=2+2) | 4/5 |
| 3rd TIME | N'+1 | 1 (=4+2−5) | 1/5 |
| 4th TIME | N' | 3 (=1+2) | 3/5 |
| 5th TIME | N'+1 | 0 (=3+2−5) | 0 |
| TOTAL | 5N+2 | 10 | 2 |
| AVERAGE | N+2/5 | 2 | 2/5 |

5,729,179

1

VARIABLE FREQUENCY DIVIDER

BACKGROUND OF THE INVENTION

The present invention relates to a variable frequency divider used in a frequency synthesizer formed of a PLL (phase-locked loop), or the like, and in particular to a variable frequency divider capable of frequency division by a frequency division ratio N+½ (N being an integer).

The invention also relates to a variable frequency division by a frequency division ratio N+B/C (N, B and C being integers).

The invention also relates to a PLL including the above-mentioned variable frequency divider.

A frequency synthesizer formed of a PLL generally comprises a voltage-controlled oscillator (VCO) 181, a variable frequency divider 182, a phase comparator 183 receiving a reference frequency fr, and a low-pass filter 184. By varying the frequency division ratio N in a programmable frequency divider 185 in the variable frequency divider 182, the voltage controlled oscillator is made to oscillate stably at a local oscillating frequency fo=N×fr which is N times the reference frequency fr. Synthesizer receivers using a local oscillating circuit formed of a frequency synthesizer, wherein the reference frequency fr is equal to the inter-station frequency difference of the reception band, and by varying the frequency division ratio N in steps of "1," the local oscillating frequency fo can be varied in steps of the inter-station frequency difference.

However, since the oscillating frequency fo of the conventional frequency synthesizer oscillates at an integer multiple of the reference frequency fr, reception of a station having an inter-station difference which is a fractional multiple of the reference frequency fr is not possible. For instance, if the reference frequency fr is 100 KHz, reception of a station having an inter-station difference of 50 KHz is not possible. It was therefore desired to lock a PLL at a fractional multiple of the reference frequency fr, and examples of circuit meeting such demands have been disclosed in Japanese Patent Kokoku Publication No. 49540/1976, and Japanese Utility Model Kokoku Publication No. 30352/1987. FIG. 33 shows an example of such a circuit.

As illustrated, the local oscillating frequency fo is supplied to a presettable counter 192 through a gate circuit 193 which inverts its output to the presettable counter 192 each time the count value of the counter 192 reaches a predetermined value, so that the counter 192 counts the pulses at the rising edges of the signal of the local oscillating frequency fo in one counting cycle, and at the falling edges in the next counting cycle, as illustrated in FIG. 34. In this way, frequency division by a frequency division ratio N+½ is achieved.

However, the N+½ frequency-divided output is input to the presettable counter as a preset signal. Accordingly, at the time of switching between counting cycles (the time when the count value is changed from "N" to "1" in FIG. 34), the counting is conducted in half a period of the local oscillating frequency fo. For this reason, the operating speed of the presettable counter 192 must be twice as high as otherwise required.

As another frequency divider, a fractional frequency divider ICSA8025 supplied by Philips is capable of fractional frequency division by a frequency division ratio N+B/C (N, B and C are integers, and B≦C). This fraction frequency divider comprises an N frequency divider, and performs N'+B/C frequency division by switching between

2

N' frequency division and N'+1 frequency division on the basis of overflow of an accumulator.

The operation of this fractional frequency divider will next be described with reference to FIG. 35 for a case of N'+⅖ frequency division. Every frequency-divided period, "2" (numerator B) is added to the value of the accumulator, and the value of the accumulator overflows at "5" (denominator C). After the first addition, the accumulator value is "2," and no overflow occurs, so that N' frequency division is conducted. After the second addition, the accumulator value is "4," and no overflow occurs, so that N' frequency division is conducted again. The sum of the third addition is "6," resulting in overflow, and "5" is subtracted from the sum and the accumulator value is therefore "1," and N'+1 frequency division is conducted because of the occurrence of the overflow.

After the fourth addition, the accumulator value is "3," and no overflow occurs, so that N' frequency division is conducted. The sum of the fifth addition is "5," resulting in overflow, and "5" is subtracted from the sum and the accumulator value is therefore "0," and N'+1 frequency division is conducted because of the overflow. In this way, average value of the frequency division ratio over five frequency-divided periods is N'+⅖, and thus N'+⅖ frequency division is achieved.

However, the above-described fractional frequency divider is associated with an error corresponding to the accumulator value. This error can be corrected by predicting the phase error in accordance with the accumulator value and subtracting the predicted error from the output of the phase comparator (183 in FIG. 32, for example). However, it is difficult to conform to the electric current in a charge pump in the low-pass filter (184 in FIG. 32, for example), to output the correction in time with the output of the charge pump, and to correctly scale with the N' frequency division ratio, so that complete correction is not possible. The error corresponding to the accumulator value cannot therefore be neglected, and it was necessary to reduce the error.

SUMMARY OF THE INVENTION

Accordingly, an object of the invention is to provide a variable frequency divider capable of N+½ frequency division using a counter operating at the same seed as N frequency division.

Another object of the invention is to provide a fraction frequency divider with an error smaller than the conventional fractional frequency divider performing the fractional frequency division by combining the N frequency division and N+1 frequency division.

A further object of the invention is to provide a PLL which includes a variable frequency divider capable of N+½ frequency division, and can compare the phases at both of the rising and falling edges of the reference signal, using phase comparators which themselves are capable of comparing the phases at the rising edges only or at the falling edges only.

According to one aspect of the invention, there is provided a variable frequency divider comprising:

a programmable frequency dividing means for frequency-dividing an input with frequency division ratios N (N being an integer) and N+1, alternately;

a first signal generating means for generating a first signal in synchronism with an output signal of the programmable frequency dividing means;

a second signal generating means for generating a second signal identical to said first signal but delayed by ½ period of said input signal; and an output means for alternately outputting said first and second signals.

According another aspect of the invention, there is provided a variable frequency divider comprising:

a two-modulus prescaler for frequency-dividing an input signal by a frequency division ratio M (M being an integer) or a frequency division ratio M+1;

a pulse swallow means having a coarse counter for causing said two-modulus prescaler to perform frequency division P2 times, and a swallow counter for causing said two-modulus prescaler to perform M+1 frequency division P1 times, out of P2 times, and thereby frequency-dividing the input signal by a frequency division ratio M×P2+P1;

a control means for causing cause said pulse swallow means to perform frequency division by M×P2'+P1' in a mode for a frequency division by N, and to alternately perform frequency division by M×P2'+P1'+M×P2'+P1' 1 in a mode for a frequency division by N+½;

a first signal generating means for generating a first signal in synchronism with the output of said coarse counter;

a second signal generating means for generating a second signal identical to said first signal but delayed by a ½ period of said input signal; and an output means for outputting said first signal in the mode for the frequency division ratio N, and alternately outputting said first signal and said second signal in the mode for the frequency division ratio N+½.

According to a further aspect of the invention, there is provided a variable frequency divider comprising:

a frequency-dividing means for performing frequency-division by a frequency-division ratio N or a frequency division ratio N+½, on the basis of a given integer N;

a control means responsive to a given integers N', B and C (N', B and C being integers, and B<C), for assigning the integer N' and another integer N'+1 to said frequency dividing means to cause said frequency dividing means to perform frequency division by a frequency division ratio N' or by a frequency division ratio N'+1, and/or by a frequency division ratio N'+½, such that an average of the frequency division ratio over C frequency-divided periods will be N'+B/C.

According to a further aspect of the invention, there is provided a variable frequency dividing apparatus comprising:

a fixed frequency divider performing frequency division by a frequency division ratio P, on the basis of a given integer P; and a variable frequency divider for frequency-dividing an output of said fixed frequency divider by a frequency division ratio N/P, where N being a variable integer.

According a further aspect of the invention, there is provided a PLL comprising:

a voltage controlled oscillator;

a variable frequency divider for frequency dividing an output of the voltage controlled oscillator by a frequency division ratio N+½ (N being an integer);

a separating means for separating output pulses from said variable frequency divider into odd-numbered pulses and even-numbered pulses;

a first phase comparator for comparing a phase of a reference signal with a phase of said odd-numbered pulses;

an inverter for inverting said reference signal;

a second phase comparator for comparing a phase of an output of said inverter and a phase of said even-numbered pulses; and a low-pass filter for converting outputs of said first and second phase comparators into a control voltage and applying the control voltage to said voltage-controlled oscillator.

BRIEF DESCRIPTION OF THE DRAWINGS

FIG. 23 illustrates a table showing the operation of FIG. 22.

FIG. 35 illustrates a table showing the operation of the ⅔ division of a conventional fractional frequency divider.

DETAILED DESCRIPTION OF THE PREFERRED EMBODIMENTS

Embodiments of the invention will next be described with reference to the drawings.

Figure 1:
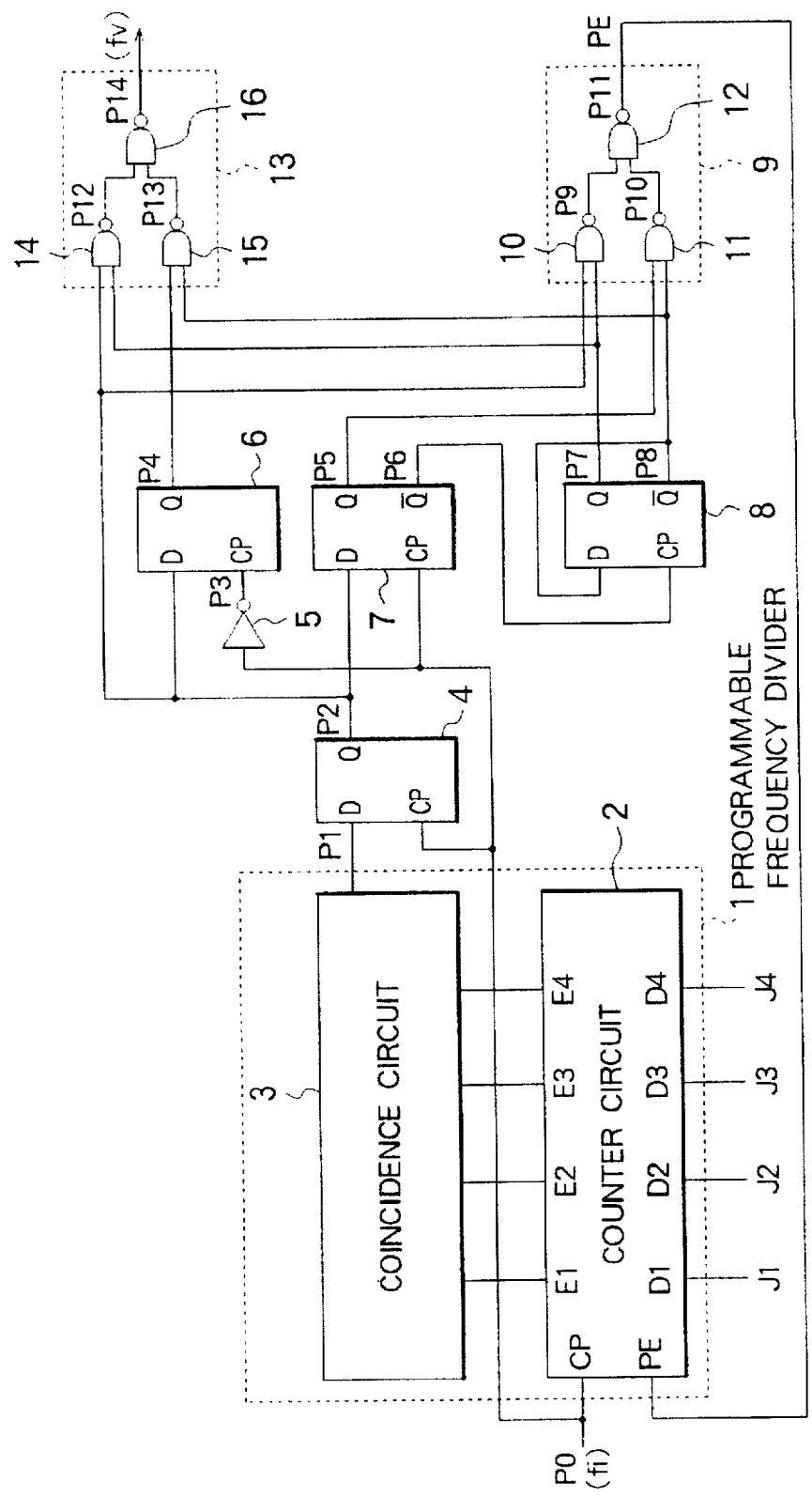
FIG. 1 is a block diagram showing the configuration of a variable frequency divider of an embodiment of the invention.
Figure 3:
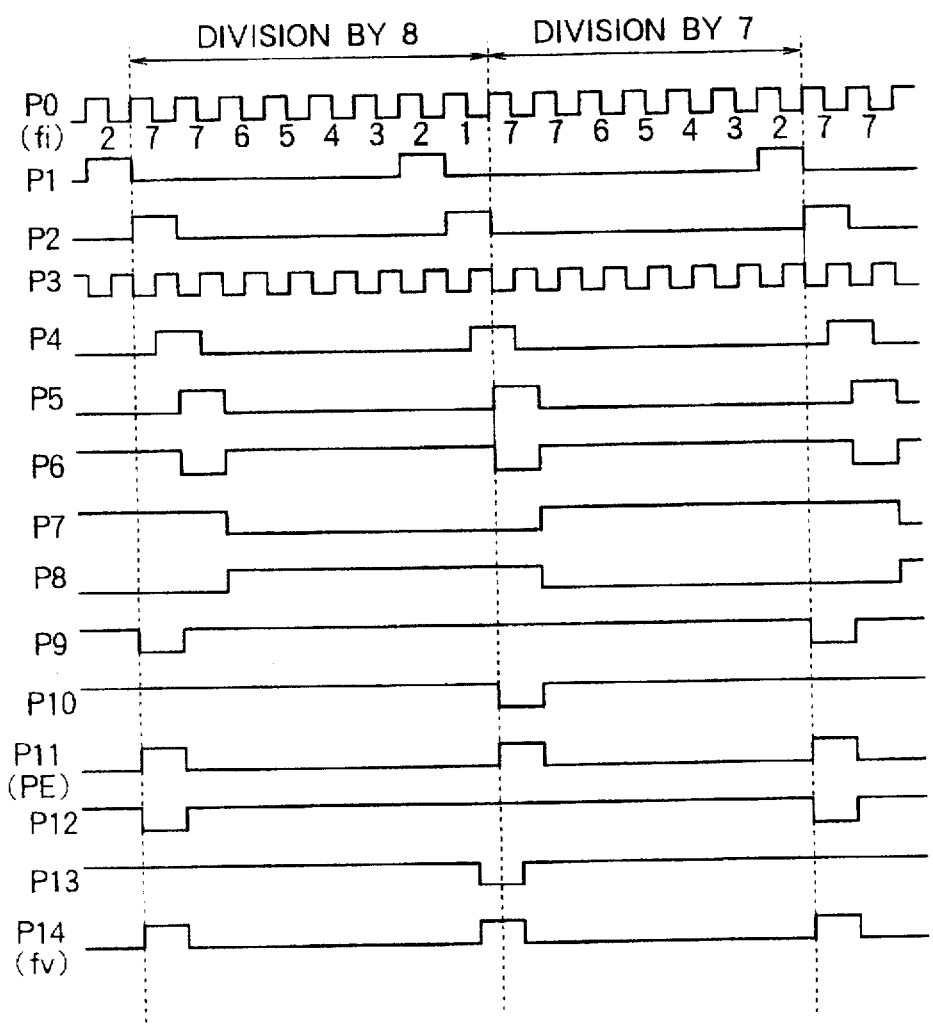
FIG. 3 is a diagram for explaining the operation of the variable frequency divider of the embodiment of FIG. 1.

FIG. 1 is a block diagram showing an embodiment of variable frequency divider according to the invention. FIG. 3 shows the operation of the variable frequency divider of this embodiment.

Figure 32:
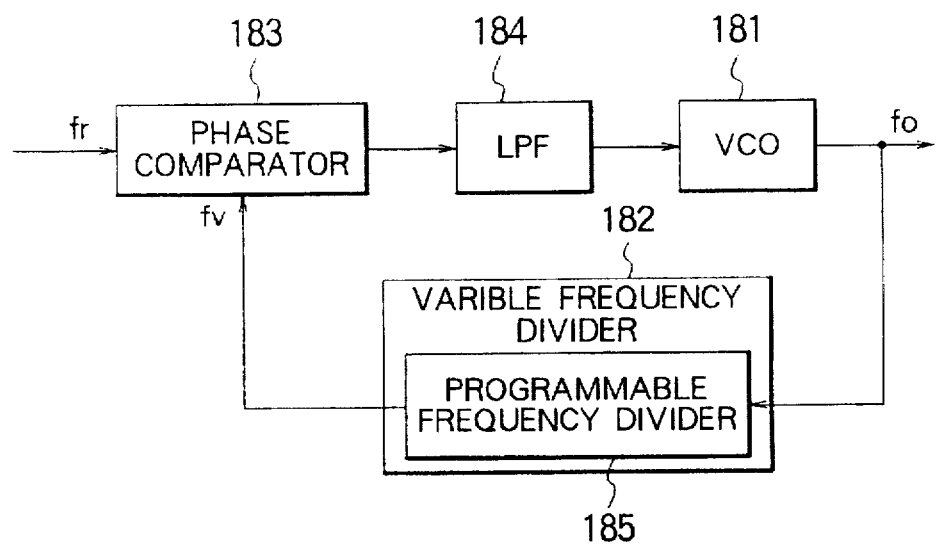
FIG. 32 is a block diagram showing the configuration of a PLL using a conventional variable frequency divider.

A signal P0 (fi) is a signal input to the variable frequency divider. It may be a signal of the local oscillating frequency fo supplied from a voltage controlled oscillator (such as the one 181 in FIG. 32) or an output of a prescaler (such as the one indicated by reference numeral 25 in FIG. 7, to be described later) frequency-dividing the signal of the local oscillating frequency. The signal P0 is clock pulses having a duty ratio of 50%, that is, its ON time and Off time are equal.

A programmable frequency divider 1 comprises a presettable counter circuit 2 and a coincidence circuit 3. The counter circuit 2 has preset value input terminals D1 to D4 for receiving a signal consisting of four bits J1 to J4, each assuming a value of "1" (=High) or "0" (=Low). The four bit signal represents a preset value for the counter circuit 2. When the signal at a terminal PE rises to High, the counter circuit 2 is loaded with the preset value as an initial value, and counts down the pulses applied to a terminal CP, starting with the initial value.

In the following description, the pulses input to the variable frequency divider, which in this embodiment are the pulses applied to the terminal CP of the counter circuit 2 may sometimes be called "input pulses," and their period may be called "input period."

Figure 2:
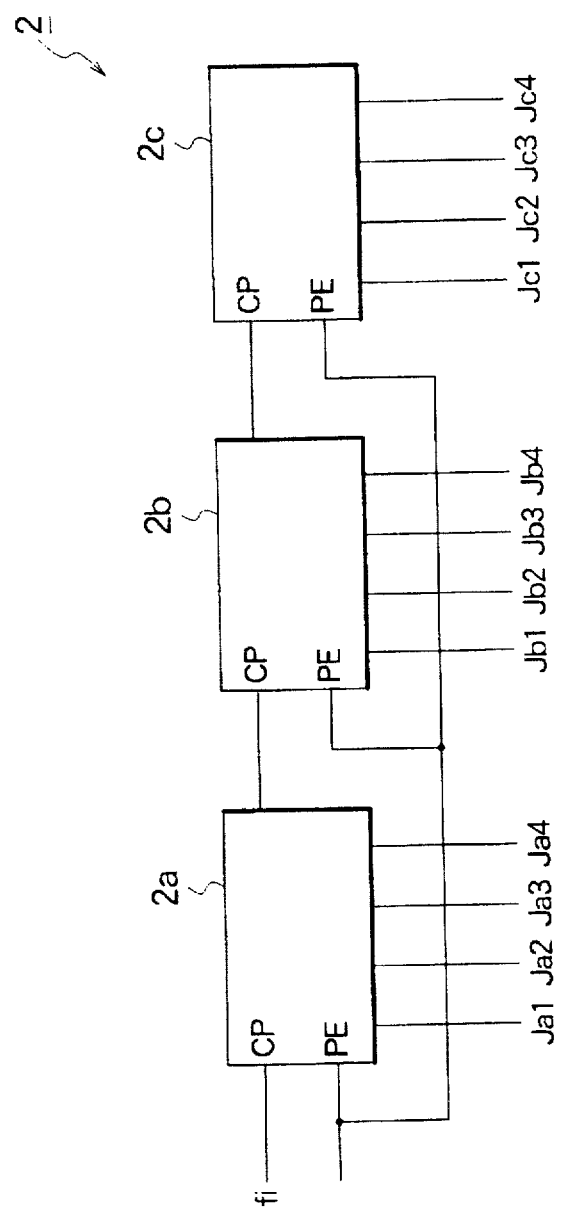
FIG. 2 is a block diagram showing the details of an example of a counter circuit in FIG. 1.

In a typical variable frequency divider having a larger frequency division ratio, the counter circuit may comprise, as shown in FIG. 2, a plurality of (three, in the illustrated example) cascaded decimal down-counters 2a, 2b and 2c, which are respectively given preset signals Ja1 to Ja4, Jb1 to Jb4, and Jc1 to Jc4 for the respective digits in binary-coded decimal representations. In the following description, the preset value is represented by a signal of four bits, J1 to J4, as shown in FIG. 1.

A detection output P1 of the coincidence circuit 3 goes High when the count output at terminals E1 to E2 of the counter circuit 2 becomes a predetermined number, e.g., "2."

A D-type flip-flop 4 generates a signal P2 which is identical to the detection output P1 of the coincidence circuit 3, but delayed by one input period (period of P0).

An inverter 5 generates a signal which is an inversion of the output of the D-type flip-flop 4. Because the ON time and OFF time of P0 are equal, P3 is ½ input period shifted with respect to P0. A D-type flip-flop 6 takes the output P3 of the inverter 5 as clock pulses, and generates a signal P4 which is identical to the output P2 of the D-type flip-flop 4 but delayed by one period of P3. Because P3 is ½ input period shifted with respect to P0, P4 is lagging behind P2 by ½ period of P0.

A D-type flip-flop 7 takes P0 as clock pulses, and generates a signal P5 which is identical to the output P2 of the D-type flip-flop 4 but delayed by one period of P0, and a signal P6 which is an inversion of P5.

A D-type flip-flop 8 takes the inverted output P6 of the D-type flip-flop 7 as clock pulses. The inverted output P8 of the D-type flip-flop 8 is fed back to its own input, so that the outputs P7 and P8 of the D-type flip-flop 8 are inverted (changed from High to Low, or Low to High) at every rising edge of P6.

A logic circuit 9 alternately outputs pulse signals which are one input period apart. It comprises three NAND gates 10, 11 and 12, and alternately selects the output P2 of the D-type flip-flop 4 and the output P5 of the D-type flip-flop 7, in synchronism with the outputs P7 and P8 of the D-type flip-flop 8, and outputs the selected signal as a preset signal. Since P2 and P5 are shifted by one input period, P11 will be a pulse signal alternately and repeatedly performing N frequency division and N+1 frequency division. The preset signal P11 is applied to the preset terminal PE of the counter circuit 2.

Another logic circuit 13 outputs an N+½ frequency-divided pulses, and comprises three NAND gates 14, 15 and 16. It alternately (every frequency-divided period) selects the output P2 of the D-type flip-flop 4 and the output P4 of the D-type flip-flop 6 in synchronism with the outputs P7 and P8 of the D-type flip-flop 8, and outputs the selected signal P14 as a frequency-divided signal. Since the ON time and OFF time of P7 and P8 are one frequency-divided period shifted, and P2 and P4 are ½ input period, P14 will be an N+½ frequency-divided pulse signal. The output signal P14 (having a frequency fv) is applied to a phase comparator (such as the one 183 in FIG. 32), as an output signal of the variable frequency divider.

The operation of the above variable frequency divider will next be described with reference to FIG. 3. For causing above variable frequency divider to perform N+½ frequency division, the signal J1 to J4 is set to designate a preset value N. In the following description, N is assumed to be "7." When the input signal P0 (fi) is input to the counter circuit 2, and the coincidence circuit 3 detects "2," the detection signal P1 is output. The output P2 of the D-type flip-flop 4 is one input period delayed with respect to P1. The output P4 of the D-type flip-flop 6 is ½ input period delayed with respect to P2 because of the inverter output P3. The outputs P5 and P6 of the D-type flip-flop 7 are one input period delayed with respect to P2. The outputs P7 and P8 of the D-type flip-flop 8 are repetitively inverted (changed between High and Low) in synchronism with the rising edges of P6.

P9 is an inversion of a logical product of P2 and P7, and is Low only when P2 is High while P7 is High. In other words, P2 being High while P7 being High is effectively detected by P9. P10 is an inversion of a logical product of P5 and P8, and is Low only when P5 (which is identical to P2 but delayed by one input period) is High while P7 ($\overline{P8}$) is Low. In other words, P5 being High while P7 being Low is effectively detected by P10. P11 (applied to PE) is an inversion of a logical product of P9 and P10, and High-level pulses of P2 and P5 (which is identical to P2 but delayed by one input period) are alternately selected and output as P11. As a result, the programmable frequency divider 1 is preset by the signal P11, and a preset value "7" is set in the counter circuit 2, which thereafter counts down from "7" as illustrated in FIG. 3. Because of the continuation of P11 being High, the count "7" is maintained for two input periods. As a result, the count varies "7," "7," "6," "5," "4," . . . until the next preset signal (of High level) is received. The preset signal is thus generated at alternate intervals of N (=7) input periods and N+1 (=8) input periods. For delaying the preset until the (N+1)-th input period after the preceding preset, the pulse (P5) is used which is delayed by one input period with respect to the pulse (P2) occurring at the N-th input period.

P12 is an inversion of a logical product of P2 and P7, and is Low only when P2 is High while P7 is High. In other words, P2 being High while P7 being High is effectively detected by P12. P13 is an inversion of logical product of P4 and P8, and is Low only when P4 (which is identical to P2, but delayed by ½ input period) is High while P7 ($\overline{P8}$) is Low. In other words, P4 being High while P7 being Low is effectively detected by P13.

P14 (fv) is an inversion of a logical product of P12 and P13, and High-level pulses of P2 and P4 (which is identical to P2 but delayed by ½ input period) are alternately selected and output as P14.

The resultant signal P14 is an N+½ frequency divided signal because it contains two pulses every (2N+1) input periods, and ½ input period delayed pulses are selected (for the formation of P14) in alternating frequency divided periods, while undelayed pulses are selected (for the formation of P14) in intervening frequency divided periods.

As has been described, the variable frequency divider according to the present embodiment comprises a preset means (logic circuit 9) for alternately selecting a pulse occurring at the N-th input periods from the preceding preset, and a pulse occurring at the (N+1)-th input periods from the preceding preset, and presetting the programmable frequency divider by means of the selected pulse, and an output means (logic circuit 13), for alternately selecting a pulse in synchronism with an output of the programmable frequency divider and a pulse ½ input period shifted with respect to the output of the programmable frequency divider, and outputting the selected signal (P14) as a frequency-divided signal.

As will be appreciated from the above description, one input period shifted signal, rather than ½ input period shifted signal is used for presetting the programmable frequency divider. Accordingly, N+½ frequency division is achieved without requiring the counter circuit 2 to operate at the double speed: the counter circuit 2 is required to operate only at the same speed as in N frequency division.

Figure 4:
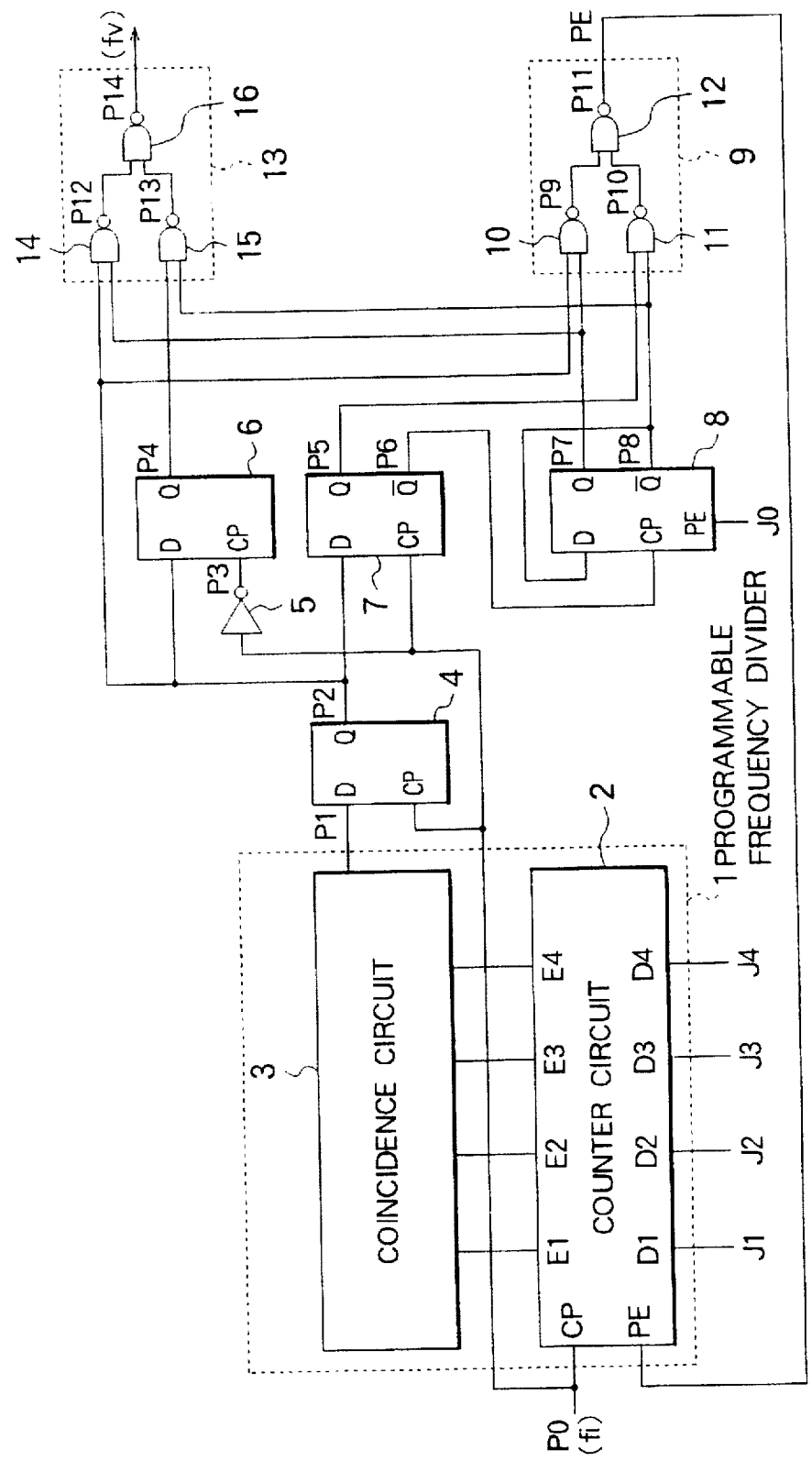
FIG. 4 is a block diagram showing the configuration of another embodiment of the invention.

FIG. 4 is a block diagram showing the configuration of another embodiment of the variable frequency divider according to the invention. Reference numerals identical to those in FIG. 1 denote identical or corresponding members or signals.

The variable frequency divider shown in FIG. 4 is generally identical to that shown in FIG. 1. The only difference is that a signal J0 designating the frequency division mode is applied to a PE terminal of the D-type flip-flop 8. This signal J0 is High when N+½ frequency division is desired, and is Low when N frequency division is desired. When the signal J0 is High, the outputs P7 and P8 of the D-type flip-flop 8 are inverted (changed between High and Low) at the rising edges of P6 (input to the CP terminal). When the signal J0 is Low, P7 is maintained High, while P8 is maintained Low.

The operation for N+½ frequency division of the variable frequency divider shown in FIG. 4 will next be described. The signal J1 to J4 are set to designate N as in the embodiment of FIG. 1. J0 input to the PE terminal of D-type flip-flop 8 is High, to designate the N+½ frequency division mode. The operation in such a state is identical to that of the embodiment of FIG. 1, and the signal P0 (having a frequency fi) is frequency divided by a frequency division ratio N+½.

Figure 5:
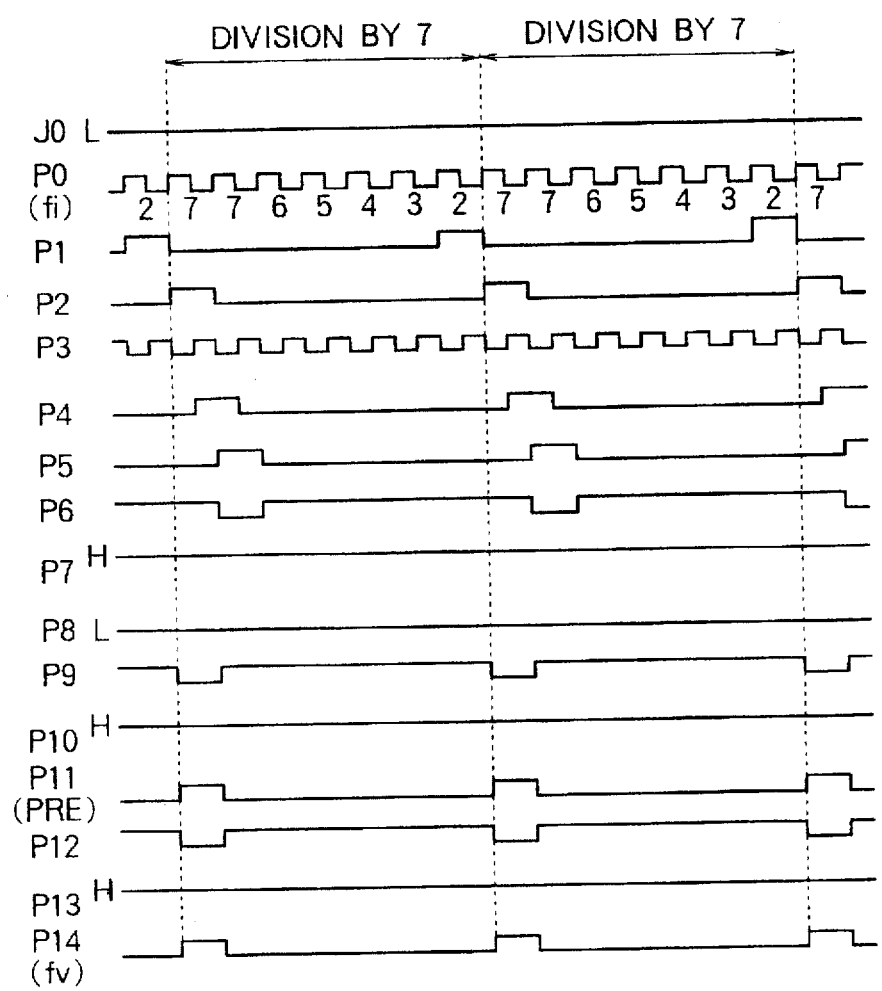
FIG. 5 is a diagram for explaining the operation of frequency division by 7 of the embodiment of FIG. 4.

The operation for N frequency division will next be described with reference to FIG. 5. The signal J1 to J4 are also set to designate N. The signal J0 applied to the PE terminal of the D-type flip-flop 8 is Low, designating the N frequency division mode.

The input signal P0 (fi) is applied to the counter circuit 2, and when the coincidence circuit 3 detects that the count of the counter circuit is "2," the detection output of the coincidence circuit 3 becomes High. The output P2 of the D-type flip-flop 4 is delayed by one input period with-respect to P1. The output P4 of the D-type flip-flop 6 is delayed by ½ input period with respect to P2, because of the output P3 of the inverter 5. The outputs P5 and P6 of the D-type flip-flop 7 are one input period delayed with respect to P2. The output P7 of the D-type flip-flop 8 is kept High, and P8 is kept Low.

P9 is an inversion of a logical product of P2 and P7, but because P7 is kept High, P9 is an inversion of P2. P10 is an inversion of a logical product of P5 and P8, but because P8 is kept Low, P10 is kept High. P11 (applied to PE of the counter circuit 2) is an inversion of a logical product of P9 and P11, but as P9 is an inversion of P2, and P10 is kept High, P11 is identical to P2. The counter circuit 2 is preset by P11, and counts down from "7" as shown in FIG. 5. Because of the continuation of High state of P11, the count "7" is unchanged for two input periods. The count-down proceeds "7," "7," "6," "5," "4," . . . until the next preset signal. When the count becomes "2," P2 again becomes High.

P12 is an inversion of a logical product of P2 and P7, but as P7 is kept High, P9 is an inversion of P2. P13 is an inversion of a logical product of P4 and P8, but as P8 is kept Low, P10 is kept High. P14 (fv) is an inversion of a logical product of P12 and P13, but as P12 is an inversion of P2, and P13 is kept High, P14 is identical to P2, and P14 is thus an N frequency-divided signal.

As has been described, when J0 applied to PE terminal of D-type flip-flop 8 is Low, the variable frequency divider frequency-divides the input signal P0 having a frequency fi by a frequency division ratio N, and the variable frequency divider shown in FIG. 4 is therefore capable of selectively performing N frequency division or N+½ frequency division.

As in FIG. 1, ½ input period shifted signal P14 (fv) is not fed back to the programmable frequency divider 1, but P11 which is not ½ input period shifted is used for the presetting. Accordingly, the counter circuit 2 needs only to operates at the same speed as in N frequency division, and yet N+½ frequency division is achieved.

Figure 6:
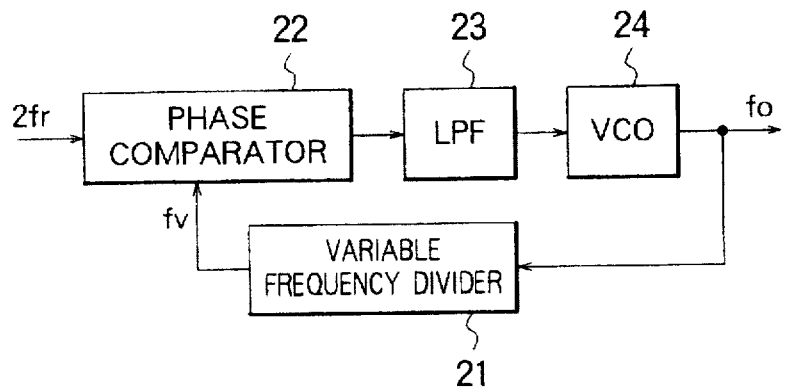
FIG. 6 is a block diagram showing a PLL using the variable frequency divider of a further embodiment of the invention.

As an example of application of the variable frequency divider of FIG. 4, a PLL employing the variable frequency divider of FIG. 4 will next be described, with reference to FIG. 6.

The variable frequency divider 21 is the one shown in FIG. 4, and can selectively performs the frequency division at a frequency division ratio N or N+½. Let us assume that a frequency divider is used to produce a frequency fv controlled to be equal to and in phase with the reference frequency fo, by dividing the local oscillating frequency fo. When a conventional frequency divider incapable of N+½ division is used, the frequency division ratio NA is changed in step wise in units of 1. In contrast, with the frequency divider according to the embodiment, the frequency division ratio can be changed in units of 0.5. Accordingly, the reference frequency fr can be doubled (into 2fr), and the frequency division ratio can be halved (into NA/2). This can be expressed by the equations as follows:

First, NA=(2N+1)/2 can be modified to be ((N+½) ×2)/2. fo=NA×fr can be rewritten as fo=(NA/2)×2 ×fr. This will be described in connection with the AM band. The AM band extends over 522 KHz to 1629 KHz. If the intermediate frequency fm is 459 KHz, the sweeping range is 522 KHz+459 KHz to 1629 KHz+459 KHz, which is equal to 981 KHz to 2088 KHz. In the present embodiment, the reference frequency is set to be 18 KHz and the frequency division ratio is varied from 54.5 to 116, in steps of 0.5. In the prior art, the reference frequency is set to be 9 KHz and the frequency division ratio is varied from 109 to 232, in steps of 1.

Thus, the frequency division ratio is halved and the reference frequency is doubled, so that the loop gain is increased, and the lock-up time is shortened.

Figure 7:
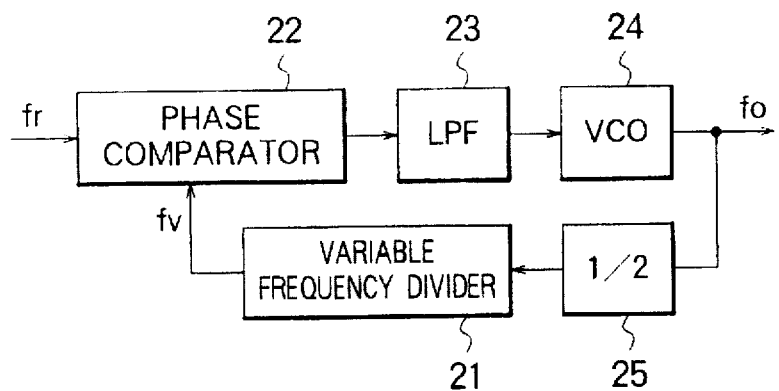
FIG. 7 is a block diagram showing a PLL of a prescaler system, using a variable frequency divider of a further embodiment of the invention.
Figure 8:
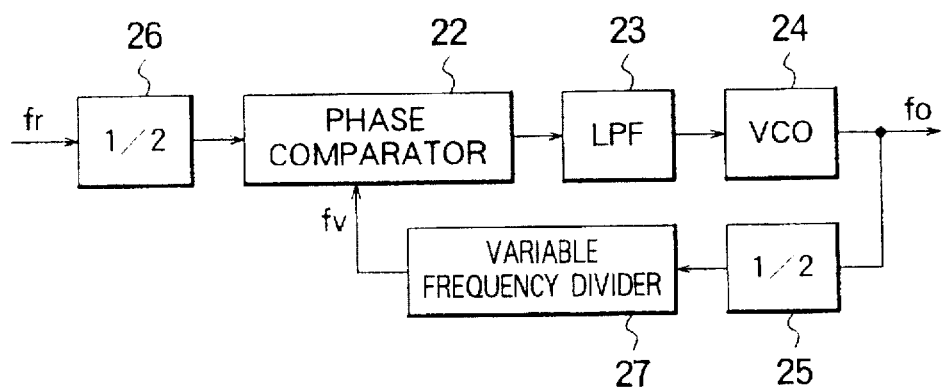
FIG. 8 is a block diagram showing a PLL of a prescaler system, using a conventional variable frequency divider.

FIG. 7 shows another example of application. FIG. 8 shows a prior art example having the same function as the configuration of FIG. 7. In an FM radio receiver having a higher frequency, the oscillating output required of the local oscillator is close to the limit of the operating speed of a TTL or C-MOS normally used to form a programmable frequency divider, and designing is difficult. For this reason, a prescaler is used. A conventional configuration employing a prescaler is shown in FIG. 8, in which a fixed frequency divider 25 is used to halve the local oscillating frequency fo, and input to the variable frequency divider 27, as shown in FIG. 8. As a correction of the fixed frequency divider 25, a fixed frequency divider 26 is added, and the reference frequency fr is halved before it is input to the phase comparator 22.

If the variable frequency divider shown in FIG. 4 is used for the variable frequency divider 21 in FIG. 7, even if the fixed frequency divider 25 is used, the reference frequency fr need not be halved, and the fixed frequency divider 26 can be omitted. That is, the operating frequency of the variable frequency divider can be doubled. If the operating frequency is identical, the power consumption can be reduced.

Figure 33:
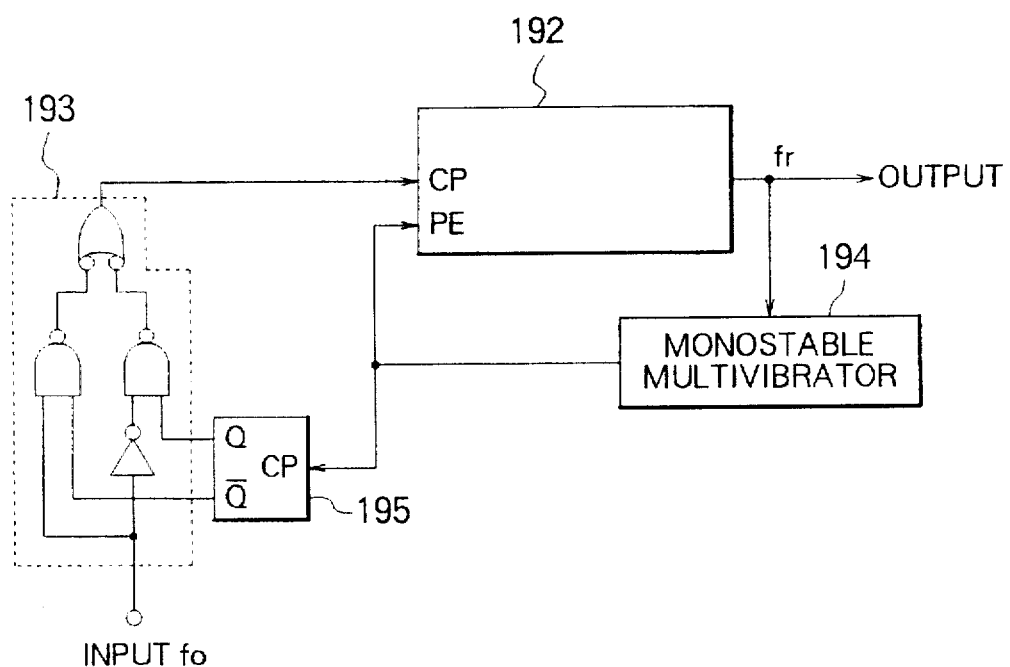
FIG. 33 is a block diagram showing the configuration of a conventional variable frequency divider.
Figure 34:
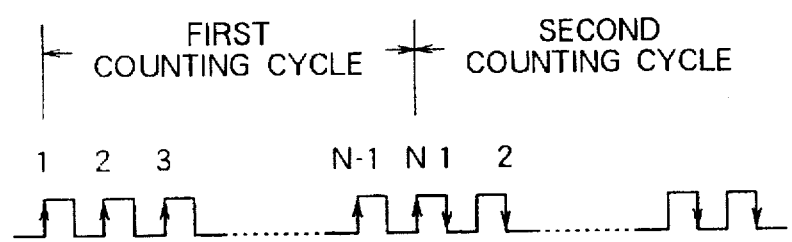
FIG. 34 is a diagram for explaining the operation of a conventional variable frequency divider.

As has been described, a variable frequency divider capable of N+½ division has a wide range of application. The variable frequency divider 21 which is capable of N+½ division and which may be used in the PLL is not limited to that illustrated in FIG. 4, but the one in which the local oscillating frequency fo is inverted (FIG. 33) may be used. However, the conventional variable frequency divider is associated with the problem that the counter built in the frequency divider must have an ability to operate at a high frequency. The use of this embodiment can solve this problem.

Figure 9:
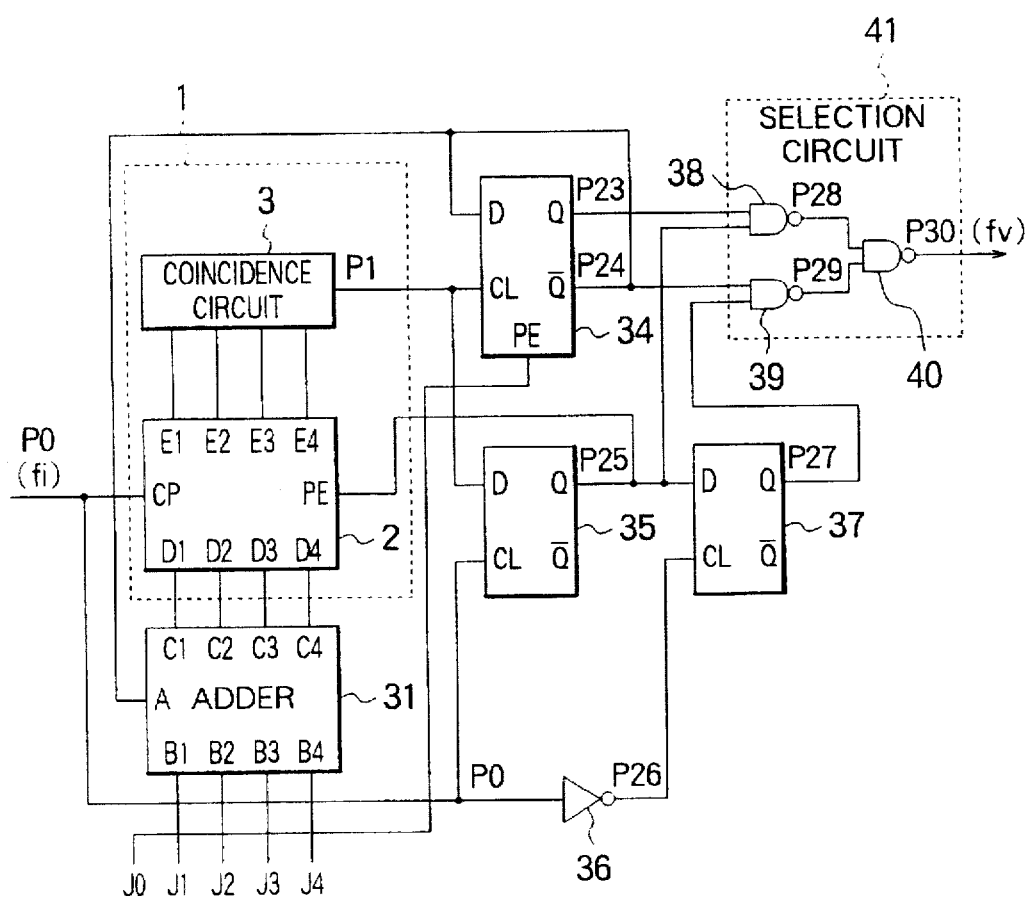
FIG. 9 is a block diagram showing the configuration of a variable frequency divider of a further embodiment of the invention.

FIG. 9 is a block diagram showing a variable frequency divider according to another embodiment of the invention. Reference numerals identical to those in FIG. 1 and FIG. 4 denote identical or corresponding members or signals.

An adder 31 receives input signals J1 to J4 representing N at its input terminals B1 to B4, and when a signal P24, to be described later, applied to terminal A is Low, the value N represented by the signals J1 to J4 applied to the terminals B1 to B4 is applied via its output terminals C1 to C4 to preset value input terminals D1 to D4 of the counter circuit 2. When P24 is High ("1"), a value (N+1) obtained by adding "1" to the set value "N" is supplied via the output terminals C1 to C4 to the terminals D1 to D4. As in Embodiments of FIG. 1 and FIG. 4, the signals J1 to J4 are set to represent N when N+½ frequency division or N frequency division is to be performed.

The counter circuit 2 takes the input signal P0 (fi) as clock pulses, and counts down the clock pulses starting with the preset value (N or N+1) supplied to the terminals D1 to D4. The counter circuit 2 is preset when a signal P25, to be described later, applied to the terminal PE goes High.

The D-type flip-flop 34 takes P1 as clock pulses, and its inverted output P24 is fed back to the A input terminal of the adder 31. When the signal J0 applied to the PE terminal is Low, it outputs a signal P23 at terminal Q, which is repetitively turned ON and OFF (switched between High and Low) in synchronism with the rising edges of P1. A signal P24 which is an inversion of P23 is output from terminal $\overline{Q}$.

When the signal J0 is High, P23 is High and P24 is Low.

The D-type flip-flop 35 outputs a signal P25 at terminal Q, which is identical to the output P1 of the coincidence circuit 3 but delayed by one input period.

The inverter 36 outputs a signal P26 which is an inversion of P0. Since P0 is a signal having equal ON and OFF times, P26 is ½ input period shifted with respect to P0.

The D-type flip-flop 37 takes, as clock pulses, P26 which is ½ input period shifted with respect to P0, and outputs, at terminal Q, a signal P27 identical to P0 but delayed by ½ input period.

The NAND gate 38 outputs a signal P28 which is an inversion of a logical product of P23 and P25. The NAND gate 39 outputs a signal P29 which is an inversion of a logical product of P24 and P27. The NAND gate 40 outputs a signal P30 (fv) which is an inversion of a logical product of P28 and P29. Because P23 and P24 are inverse to each other, P25 and P27 are alternately selected by P23 and P24, to form P30. That is, the selection circuit 41 formed of the three NAND gates 38, 39 and 40 serves to alternately output P25 and P27, at intervals of the periods of the outputs of the D-type flip-flop 34.

The operation of the variable frequency divider of the above configuration will next be described. The variable frequency divider performs N+½ frequency division when J0 is Low ("0"), and performs N frequency division when J0 is High ("1").

Figure 10:
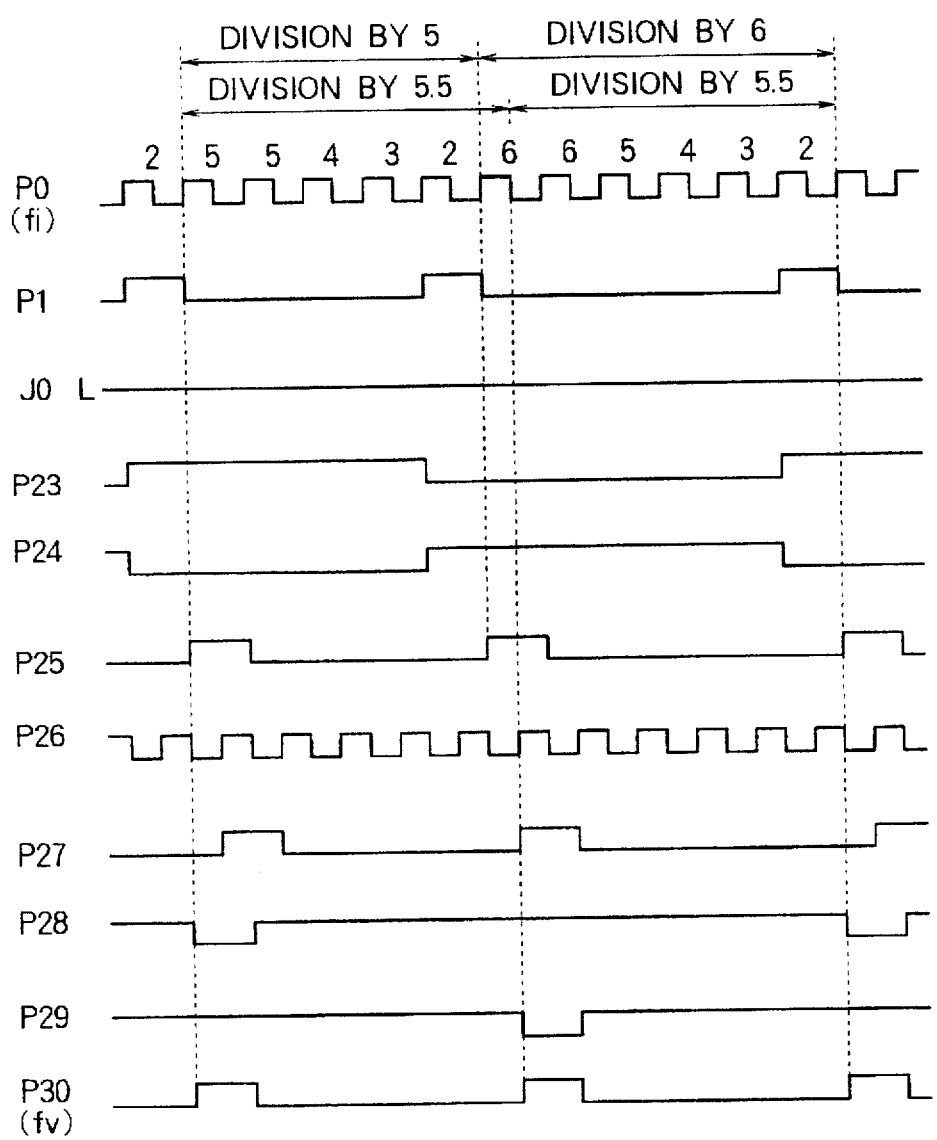
FIG. 10 is a diagram for explaining the operation of division by 5.5.

The operation for N+½ (assumed to be 5.5 in the example discussed) frequency division will first described, with reference to FIG. 10.

J0 is set to "0," and J1 to J4 are set to represent a set value "N=5." If P24 is initially Low, the set value N=5 is passed to the counter circuit 2 without modification, and the counter circuit 2 takes "5" as the initial value. When P24 is High, N+1=6 is applied to the counter circuit 2, and the counter circuit 2 counts down, taking N+1=6 as the initial value. The detection signal P1 goes High when the coincidence circuit 3 finds that the count of the counter circuit 3 becomes "2."

Assume first that P24 is initially Low. Because J0 is Low, the outputs P23 and P24 of the D-type flip-flop 34 are repetitively changed between High and Low at the rising edges of P1. The output P25 of the D-type flip-flop 35 is one input period delayed with respect to P21. When P25 goes High, the counter circuit 2 is preset. The output P27 of the D-type flip-flop 37 is ½ input period delayed with respect to P25, because of the output P26 of the inverter 36.

The output P28 of the NAND gate 38 is an inversion of a logical product of P23 and P25, and the pulses of P25 which is one input period delayed with respect to P1 are extracted to form P28. The output P29 of the NAND gate 39 is an inversion of a logical product of P24 and P27, and the pulses of P27 which is ½ input period delayed with respect to P25 are extracted to form P29. The output P30 (fv) of the NAND gate 40 is an inversion of a logical product of P28 and P29, and the pulses of P25 and P28 are combined, or alternately selected in synchronism with the operation of the D-type flip-flop 34, to form P30.

P24 is applied to the terminal A of the adder 31. When P25 rises to High while P24 is Low, the counter circuit 2 is preset to "5." When P25 goes High while P24 is High, the counter circuit 2 is preset to "6." The count of the counter circuit 2 thus changes, assuming the values "5," "5," "4," "3," "2," "6," "6," "5," "4," "3," and "2," and repeats the same cycle of changes.

If J0 is "0," when the count of the counter circuit 2 becomes "2," the preset value of the counter circuit 2 is changed from "5" to "6" or "6" to "5." When the preset value is "5," (conducting 5 frequency division), the pulse of the detection signal P25 detecting "2" and in synchronism with the rising edge of P0 is extracted. When the preset value is "6," (conducting 6 frequency division), the pulse of P27 which is in synchronism with the falling edge edge of P0 and is ½ input period delayed with respect to P25 is extracted. Because of such an alternate extraction, pulses which occur every 5.5 input periods are obtained, and 5.5 frequency division is achieved. Thus, when J0 is "0," the variable frequency divider can perform N+½ frequency division on the input signal P0 having a frequency fi.

In the above description, it was assumed that P24 is initially Low. If P24 is initially High, the initial preset value for the counter circuit 2 is "6," and the pulse of P27 is selected first. But the operation is similar to that described.

Figure 11:
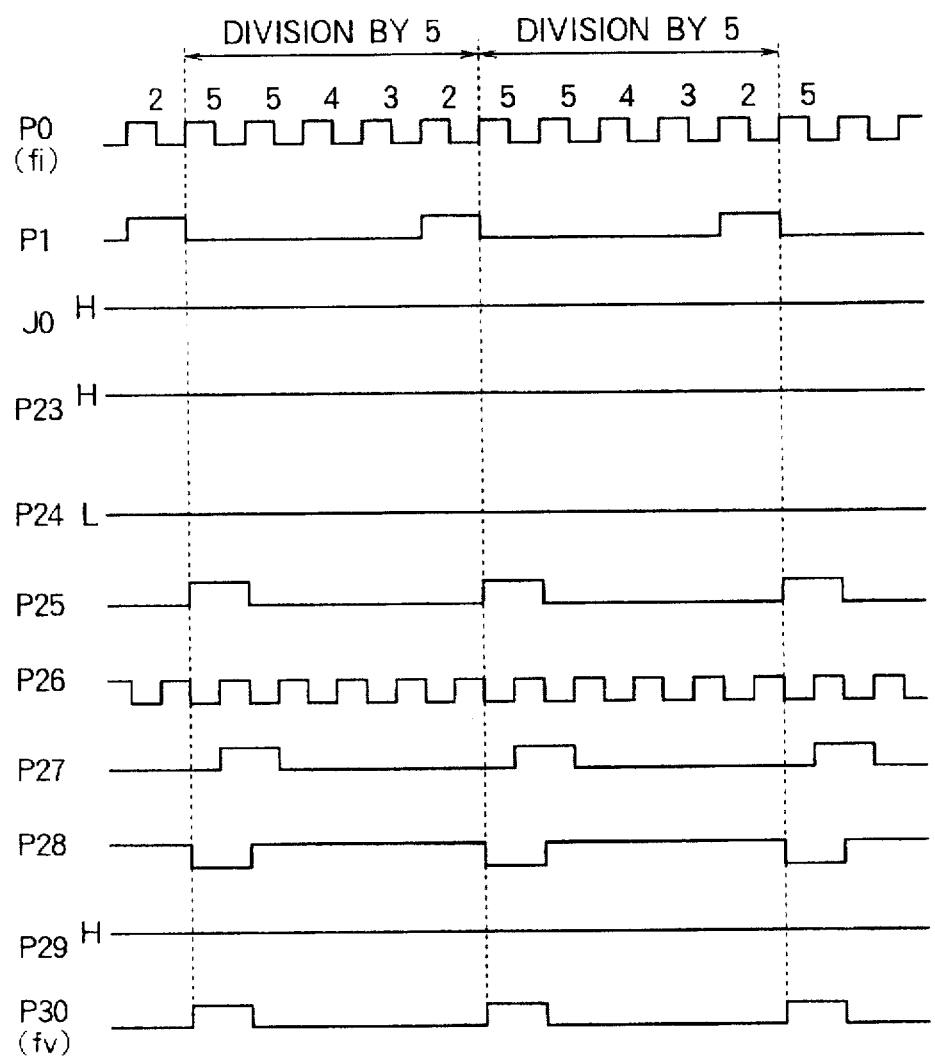
FIG. 11 is a diagram for explaining the operation of division by 5.

The operation for N (=5) frequency division will next be described with reference to FIG. 11.

J0 is set to be High ("1"), J1 to J4 are set to represent "5." The set value "5" is applied, without modification, to the counter circuit 2. The counter circuit 2 counts down P0, and when "2" is detected by the coincidence circuit 3, the detection signal P1 goes High. Because J0 is High, the output P23 of the D-type flip-flop 34 is kept High, and P24 is kept Low. P24 applied to the terminal A of the adder 31 is kept Low, and the preset value of the counter 2 is always "5." Moreover, the selection circuit 41 keeps selecting P25 because P23 is kept High and P24 is kept Low. That is, P30 (fv) is identical to P23.

As was described for the N+½ frequency division, the output P25 of the D-type flip-flop 35 is ½ input period delayed with respect to P1, and the counter circuit 2 is reset by the pulses of P25.

In this way, when J0 is "1," the D-type flip-flop 34 causes the counter circuit 2 to keep performing frequency division by 5, and the selection circuit 41 to keep selecting P25. Accordingly, P30 is a 5-frequency divided signal. That is when J0 is "1," the variable frequency divider can frequency-divides the input signal P0 of a frequency fi by a frequency division ratio N.

As has been described, the above described variable frequency divider is capable of selectively performing N frequency division or N+½ frequency division. The switching between the different frequency division ratios is carried out at a specific timing (e.g., immediately after P25 or P27 goes Low).

The frequency division ratio can be varied in steps of ½. Accordingly, as was described in connection with the embodiment of FIG. 4, the frequency division ratio can be made half, and the reference frequency can be doubled, with the result that the loop gain is increased, and the lock-up time is shortened.

The ½ input period shifted pulses are not used for presetting the counter circuit 2, so that, even for N+½ frequency division, it is sufficient for the counter circuit 2 to operate at the same speed as in N frequency division, as was also described previously.

Figure 12:
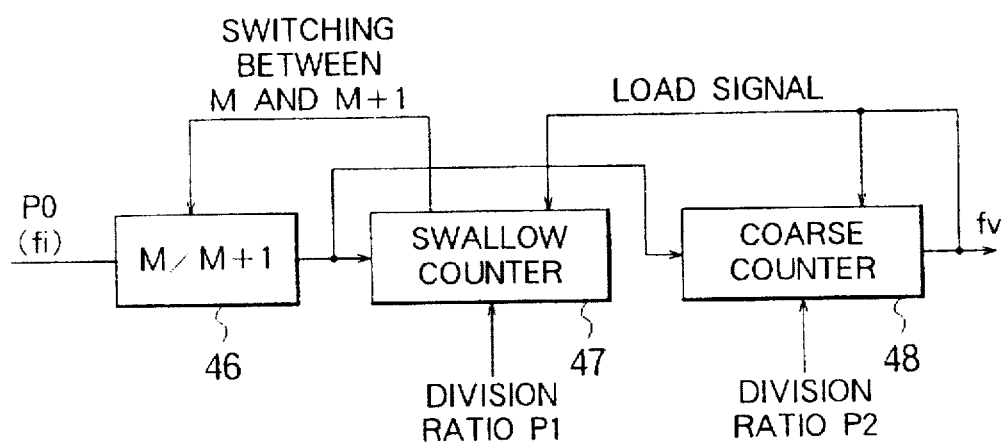
FIG. 12 is a block diagram showing the principle of a pulse swallow system.

Another embodiment, which is a pulse swallow system employing the embodiment of FIG. 9 will next be described. Pulse swallow systems are used for FM receivers, and shortwave broadcasting receivers. Its principle is shown in FIG. 12. A two-modulus prescaler 46 can selectively perform frequency division by a frequency division ratio M (a positive integer) or M+1. The total number of times frequency division is performed in one cycle is P2 set in the coarse counter 48, and the number of time frequency division is performed by a frequency division ratio M+1 is P1 set in the swallow counter 47.

The frequency division ratio over one cycle is therefore (M+1)×P1+M×(P2−P1)=M×P2+P1. Here P2≧P1. The frequency division ratio of the pulse swallow system can therefore be varied by changing the value of P1 and P2. Moreover, the frequency division ratio of the programmable frequency divider operating at a high frequency is switched between two values (M and M+1), so that the propagation delay time can be shortened, and the operating speed can be improved.

If M=10, the frequency division ratio is 10×P2+P1, in which P1 represents the value of one's place, and P2 (provided that P2≦9) represents the value of the ten's place.

If the circuit shown in FIG. 9 is incorporated in the pulse swallow system, a variable frequency divider capable of frequency division by a frequency division ratio M×P2+P1+½.

Figure 13:
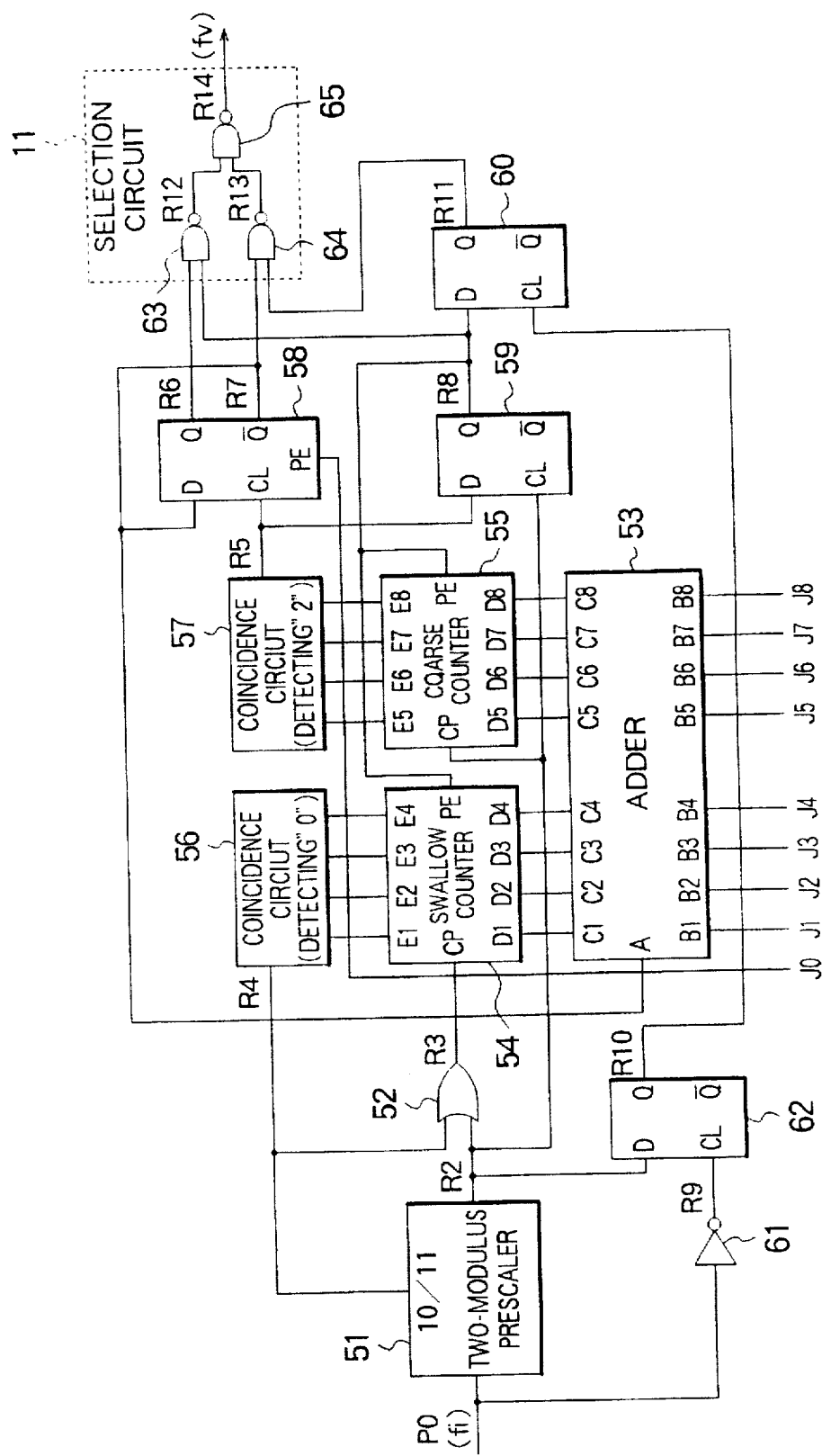
FIG. 13 is a block diagram showing the configuration of a further embodiment of the invention.

In the following description, it is assumed that M=10, P2=5, P1=2, to perform frequency division by a rate 52.5 or 52. FIG. 13 shows the configuration of the present embodiment. Members similar to those in FIG. 9 are denoted by identical reference numerals, and their description is omitted.

The variable frequency divider is supplied with a signal J0 which is "0," when N+½ frequency division is to be performed, and is "1," when N frequency division is to be performed, signals J1 to J4 designating the frequency division ratio P1 of the lower digit, and J5 to J8 designating the frequency division ratio P2 of the higher digit, and the input signal P0 (fi). Each of J0 to J8 assumes either a Low (0) or High (1) state. P0 consists of pulses having equal Low and High times.

A two-modulus prescaler 51 frequency-divides an input signal P0 by a frequency division ratio 10 when signal R4 input to the terminal 10/11 is High, or by a frequency division ratio 11 when the signal R4 is Low, and outputs the frequency divided signal R2. An output R3 of an OR gate 52 is a logical sum of R2 and R4. An adder 53 is provided with a terminal A receiving a signal R7. When the signal R7 is Low, the set value represented by J1 to J8 input to the terminal B1 to B8 is output to the swallow counter 54 and the coarse counter 55. When the signal R7 is High, "1" is added to the set value represented by J1 to J4, and the result is output via terminal C1 to C4 to the swallow counter 54. If there is a carry, the set value represented by J5 to J8 is also increased by 1. Such a carry occurs when the number of digits of P2 (given in decimal notation) is larger than the number of the digits (given in decimal notation) of P1, e.g., when P2 is a two-digit number and P1 is a one-digit number.

The swallow counter 54 takes the input set value as an initial value, and counts down R3. When the coincidence circuit 56 detects the value "0" of the swallow counter 54, its output R4 goes High. The coarse counter 55 and the coincidence circuit 57 (detecting "2") corresponds to the counter circuit 2 and the coincidence circuit 3 in the embodiment of FIG. 9, and their description is omitted.

The D flip-flops 58, 59 and 60 correspond to the D flip-flops 34, 35 and 37 in FIG. 9, and their description is omitted. The clock pulses for the D flip-flop 59 are R2, and its output R8 is input to the PE terminals of the coarse counter 55 and the swallow counter 54.

The output R9 of an inverter 61, which is an inversion of P0 is input as clock pulses to a D flip-flop 62, which receives as input R2, and its output R10 is input as clock pulses to a D flip-flop 60. (1) The output R11 of the D flip-flop 60 is delayed by half a period of P0 with respect to the output signal R8 of the D flip-flop 59.

Because of the above configuration, if J0 is Low, when the value of the swallow counter 54 becomes "0," the two-modulus prescaler 51 is switched from frequency division by 11 to frequency division by 10. That is, (2) frequency division by 11 is repeated the number of times equal to the preset value for the swallow counter 54.

Moreover, R4 goes High, and is maintained High until preset by R8. By the output R3 which is a logical sum of R4 and R2, frequency division by 10 is maintained. R5 goes High when the value of the coarse counter 55 becomes "2," and R8 is identical to R5 but delayed by one period of R2. As a result, (3) frequency division by 10 is repeated the number of times equal to the preset value (which in this case is "5") for the coarse counter 55 minus the preset value (which in this case is "2" or "3") for the swallow counter 54.

Because of (1), (2) and (3) above, frequency division is performed with a frequency division ratio M×P2+P1+½ when J0 is "0," and frequency division is performed with a frequency division ratio M×P2+P1 when J0 is "1."

Figure 14:
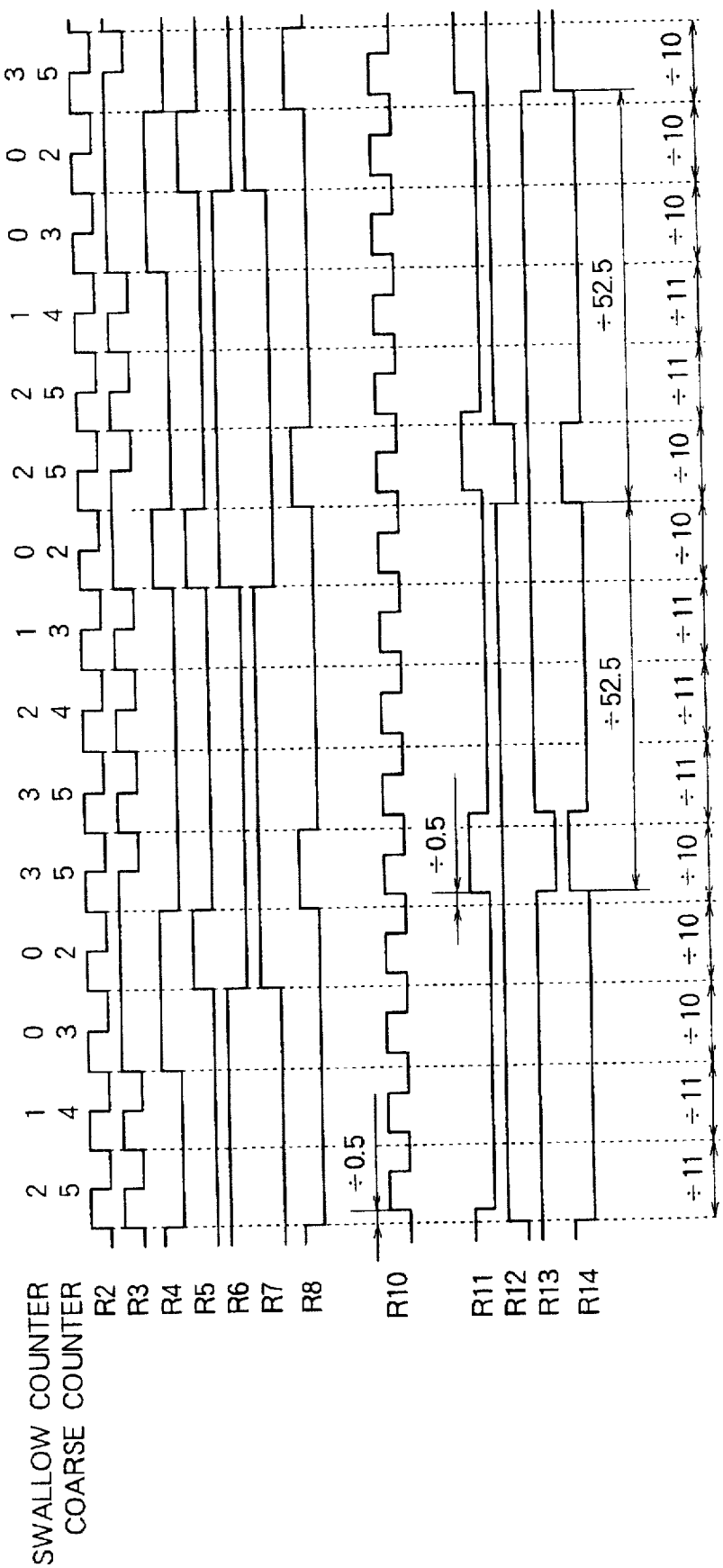
FIG. 14 is a diagram for explaining the operation of division by 52.5 of the embodiment of FIG. 13.
Figure 15:
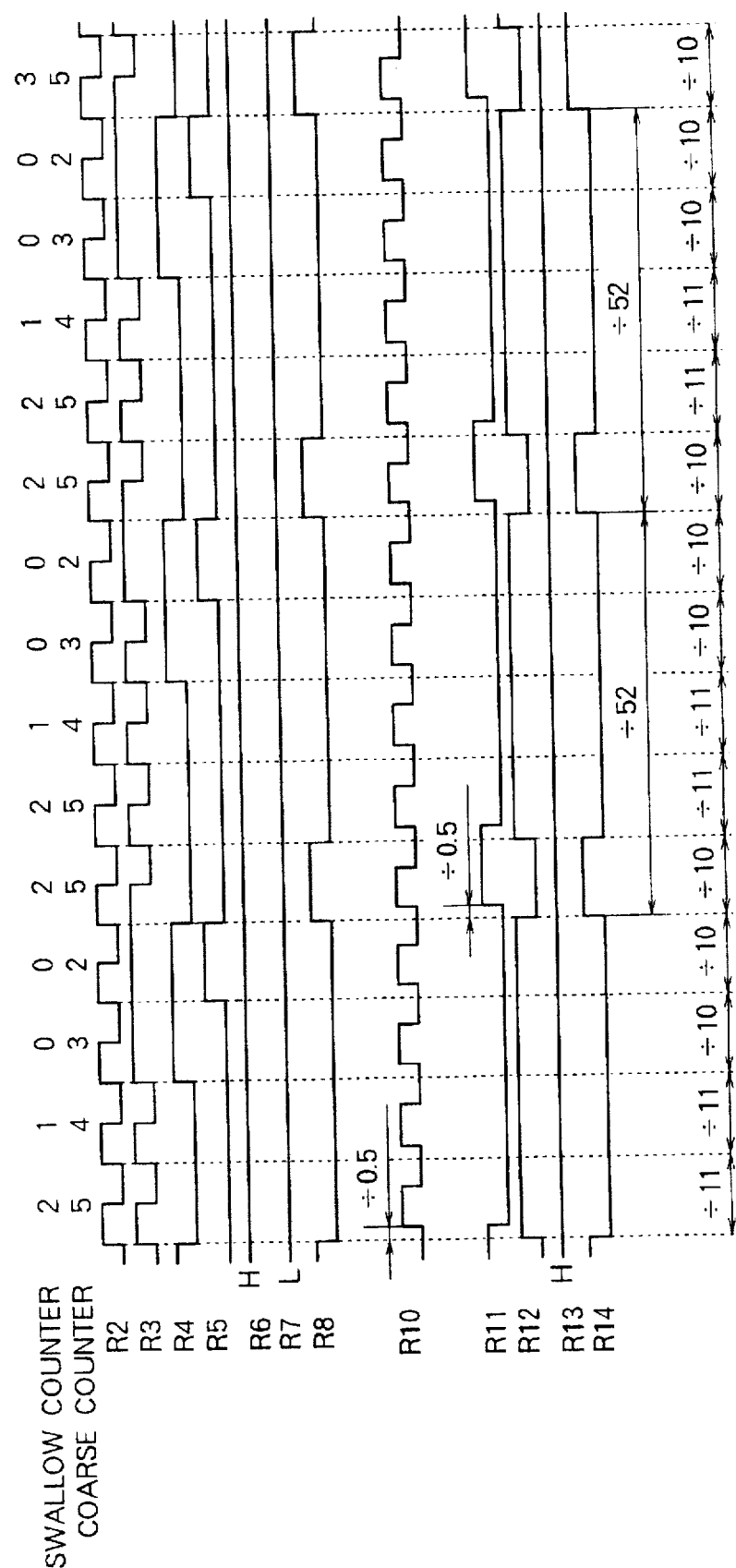
FIG. 15 is a a diagram for explaining the operation of division by 52 of the embodiment of FIG. 13.

FIG. 14 shows the operation for frequency division by 52.5 of the embodiment of FIG. 13. J0 is "0," and J1 to J4 represent "2," and J5 to J8 represent "5." FIG. 15 shows the operation for frequency division by 52. J0 is "1," and J1 to J4 represents "2," and J5 to J8 denote "5."

As has been described, the embodiment of FIG. 9 can be adopted to a pulse swallow system. That is, in a pulse swallow system, M×P2+P1 frequency divided signal and M×P2+P1+1 frequency divided output are alternately output by addition of 1 to the set value at the adder at alternating frequency divided periods, as in FIG. 9, on the basis of a signal R7 which is inverted responsive to the detection signal R5 of coincidence circuit 57 associated with the coarse counter 55, and a signal R8 in synchronism with R5, and a signal R11 identical R5 but delayed by half a period of the input signal P0 are alternately output, so as to achieve M×P2+P1+½ frequency division.

Figure 16:
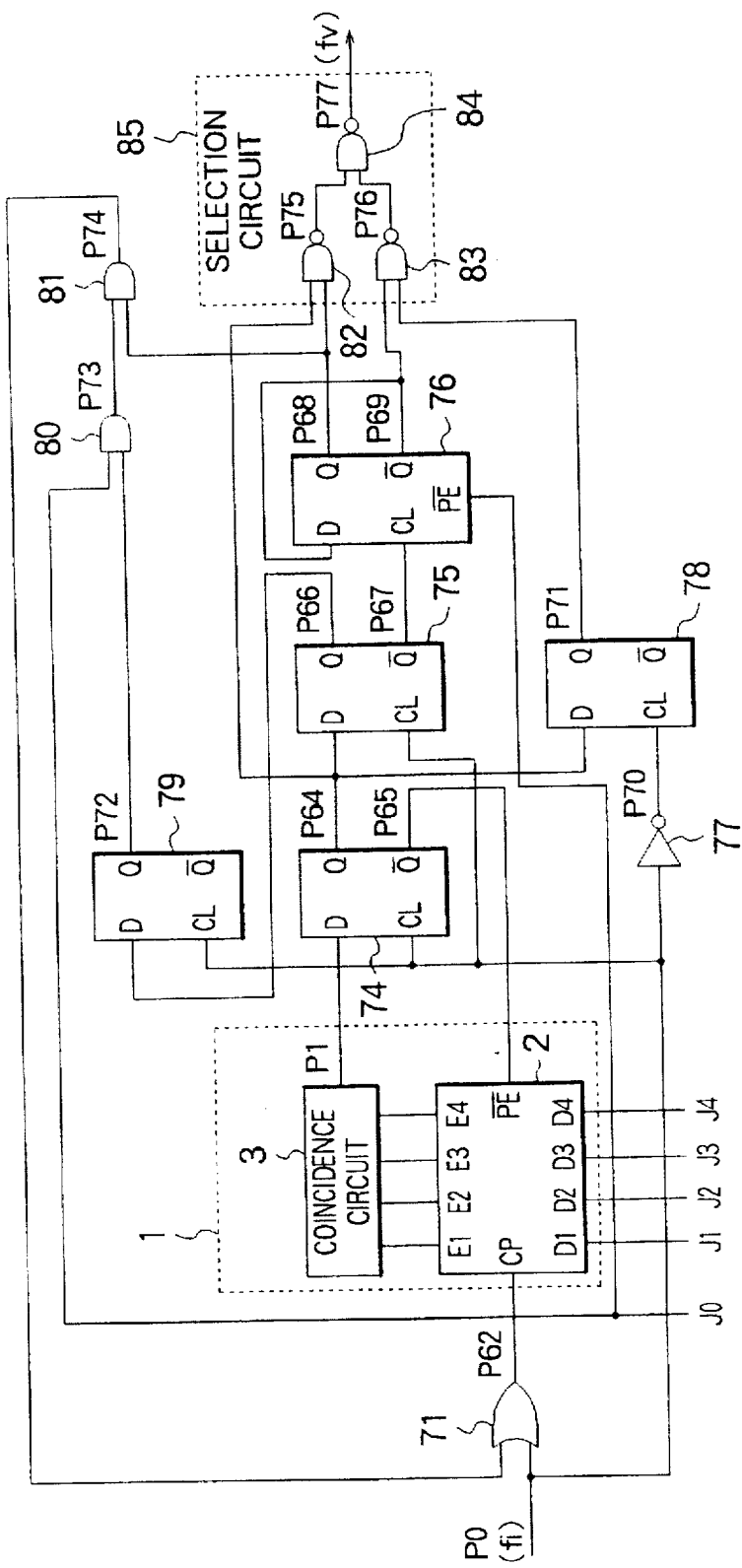
FIG. 16 is a block diagram showing the configuration of a variable frequency divider of a further embodiment of the invention.

FIG. 16 is a block diagram showing a variable frequency divider of a further embodiment of the invention. The reference numerals identical to those in FIG. 1, FIG. 4 and FIG. 9 denote identical or corresponding members or signals.

An OR gate 71 outputs a signal P62 which is a logical sum of P0 and P74, to be described later. The counter circuit 2 takes the preset value N applied to the terminals D1 to D4 as an initial value, and counts down clock pulses P62 applied to its terminal CP, and stops and re-starts the counting when a signal P65, to be described later, applied to terminal $\overline{PE}$ goes Low. The coincidence circuit 3 outputs a detection signal which goes High when the count output of the counter circuit 2 becomes "2."

The D-type flip-flop 74 takes P0 as clock pulses, and outputs, at a terminal Q, a signal P64 which is identical to the output P1 of the coincidence circuit 3, but delayed by one input period, and a signal P65 which is an inversion of P64, at terminal $\overline{Q}$. The D-type flip-flop 75 takes P0 as clock pulses, and outputs, at a terminal Q, a signal P66 which is identical to P64 but delayed by one input period, and a signal P67 which is an inversion of P66 at a terminal $\overline{Q}$.

The D-type flip-flop 76 takes P67 as clock pulses, and its inverted output P69 is fed back to its D input. When J0 applied to the terminal $\overline{PE}$ is High, P68 at the terminal Q is changed between High and Low in synchronism with the rising edges of P67, and P69 at $\overline{Q}$ is an inversion of P68. When J0 is Low, P68 is kept High, and P69 is kept Low.

The inverter 77 outputs a signal P70 which is an inversion of P0. P0 has equal High and Low periods, so that P70 is ½ input period shifted with respect to P0. The D-type flip-flop 78 takes P70 as clock pulses, and outputs, at terminal Q, a signal P71 which is identical to P64 but delayed by one period of P70. Because P70 is ½ input period shifted with respect to P0, P71 is ½ input period delayed with respect to P64.

The D-type flip-flop 79 takes P0 as clock pulses, and outputs, at terminal Q, a signal P72 which is identical to P66 but delayed by one input period. An AND gate 80 outputs a signal P23 which is a logical product of P72 and J0. Another AND gate 81 outputs a signal P74 which is a logical product of P73 and P68.

A NAND gate 82 output a signal P75 which is an inversion of a logical product of P64 and P68. Another NAND gate 83 outputs a signal P76 which is an inversion of a logical product of P71 and P69. A further NAND gate 84 outputs a signal P77 which is an inversion of a logical product of P75 and P76. Because P68 and P69 are inverse to each other, the pulses of P64 and P71 are alternately selected, in synchronism with P68 and P69, to form P77. That is, the selection circuit 85 formed of three NAND gate gates 82, 83 and 84 alternately selects the pulses of P64 and P71 in synchronism with the D-type flip-flop 76.

The operation of the variable frequency divider of the above configuration will now be described. J1 to J4 are set to designate N. When J0 is "1," N+½ frequency division is performed, while when J0 is "0," N frequency division is performed.

Figure 17:
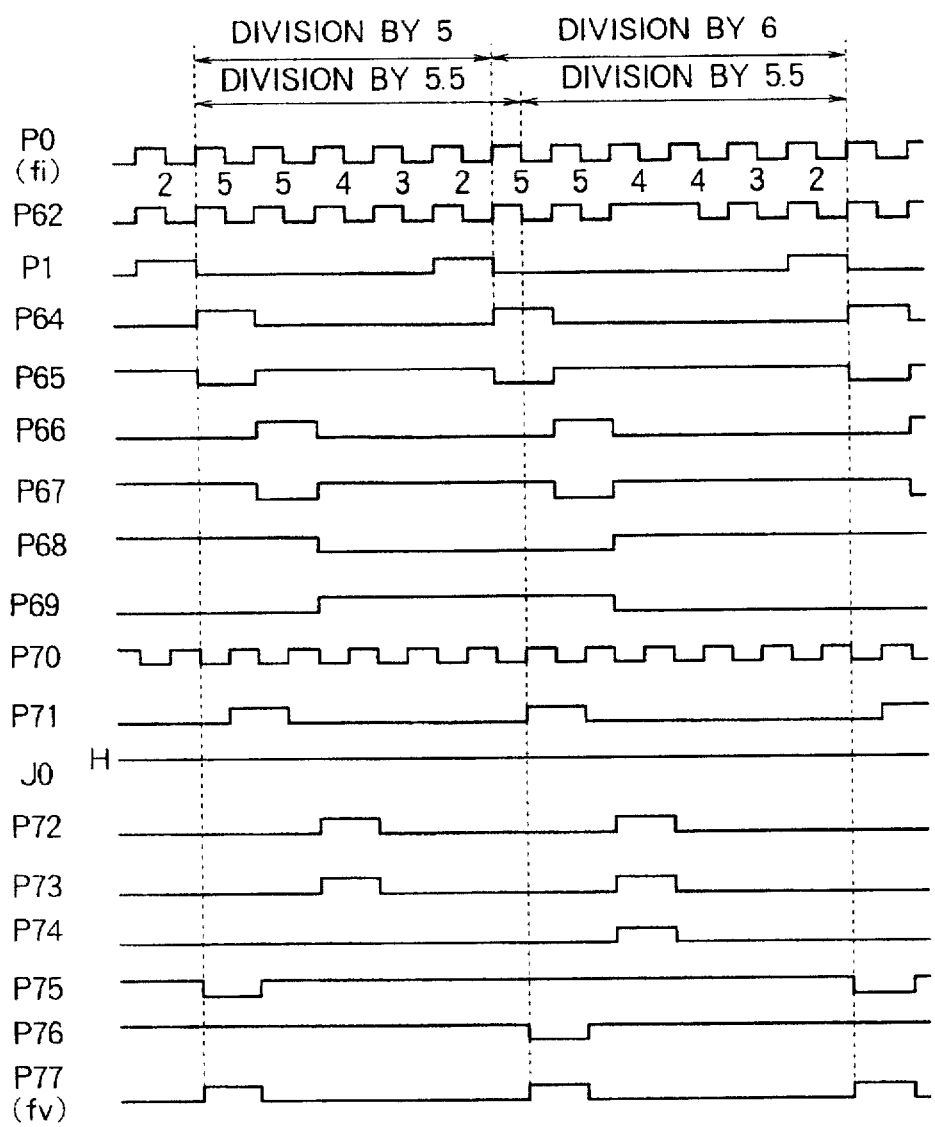
FIG. 17 is a a diagram for explaining the operation of frequency division by 5.5 of the embodiment of FIG. 13.

First, the operation for N+½ (here, 5.5) frequency division will be described with reference to FIG. 17. J1 to J4 are set to designate N=5. An input signal P0 having a frequency fi is input to the OR gate 71. The value of P74 is unknown, so that P62 is first assumed identical to P0. P62 is input to the counter circuit 2, and when "2" is detected by the coincidence circuit 3, a detection signal P1 is output.

The outputs P64 and P65 of the D-type flip-flop 74 are one input period delayed with respect to P1. The Low pulse of P65 presets the counter circuit 2. The outputs P66 and P67 of the D-type flip-flop 75 are one input period delayed with respect to P64. As J0 is High, the outputs P68 and P69 of the D-type flip-flop 76 are changed between High and Low at the rising edges of P67. The output P71 of the D-type flip-flop 78 is ½ input period delayed with respect to to P64 because of the output P70 of the inverter 77.

The output P72 of the D-type flip-flop 79 is one input period delayed with respect to with respect to P66. The output P73 of the AND gate 80 is a logical product of J0 and P72, and is therefore identical to P72 since J0 is kept High. The output P74 of the AND gate 81 is a logical product of P68 and P73, so that every other High pulses of P73 are suppressed by P68.

The output P62 of the OR gate 71, which is a logical sum of P74 and P0 is a sequence of pulses similar to P0, but two pulses in the period when P74 is High is merged into a single pulse, and the number of rising edges of the pulses are reduced by one. As a result, although the preset value of the counter circuit 2 is "5," P1 becomes High when six pulses of P0 have been input.

The output P75 of the NAND gate 82 is an inversion of a logical product of P64 and P68, and extracts High pulses of P64 which is identical to P1 but delayed by one input period. The output P76 of the NAND gate 83 is an inversion of a logical product of P71 and P69, and extracts High pulses of P71 which is identical to P64 but delayed by ½ input period. The output P77 of the NAND gate 84 is an inversion of a logical product of P75 and P76, and combines the pulses of P75 and P76. That is, P64 and P71 are alternately selected in synchronism with the operation of the D-type flip-flop 76, to form P77. Since P64 and P71 are ½ input period shifted with respect to each other, P77 is a 5.5 frequency-divided signal.

In this way, when J01 is "1," the variable frequency divider divides the input signal P0 of a frequency fi by a frequency division ratio N+½.

Figure 18:
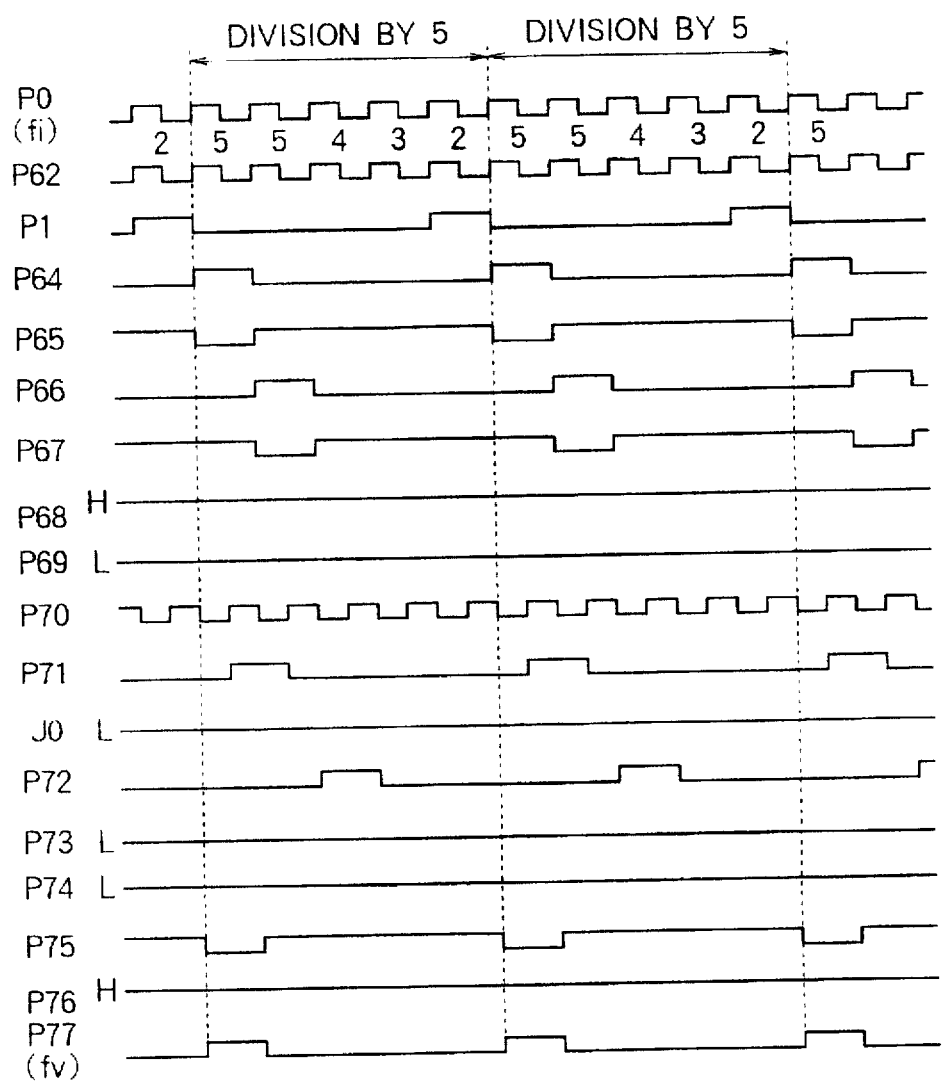
FIG. 18 is a a diagram for explaining the operation of frequency division by 5 of the embodiment of FIG. 13.

The operation for N (=5) frequency division will next be described with reference to FIG. 18. J0 is set to be "0" and J1 to J4 are set to designate "5." The input signal P0 (fi) is input to the OR gate 71.

Since J0 is Low, the output P73 of the AND gate 80 is Low, and the output P74 of the AND gate 81 is Low.

Since P74 is Low, the output P62 of the OR gate 71 is identical to P0. That is, deletion of the pulses of P0 which occurs when J0 is "1" does not occur. That is, upon input of every five pulses of J0, the detection signal P1 goes High, and the counter circuit 2 is preset by the signal P65 which is one input period delayed with respect to P1, and starts counting down from the initial value "5".

Since J0 is kept Low, the output P68 of the D-type flip-flop 76 is kept High, while the output P69 is kept Low. Accordingly, the signal P64 which is one input period delayed with respect to P1 continues to be selected by the selection circuit 85, to form the frequency-divided signal P77 (fv).

Like P1 and P64, the signal P77 consists of pulses generated every five input pulses, and is therefore a signal which is frequency-divided by "5."

In this way, when J0 is 0, the variable frequency divider frequency-divides the input signal P0 by a frequency division ratio N.

As has been described, the variable frequency divider shown in FIG. 16 is also capable of selective frequency division either at a frequency division ratio N or a frequency division ratio N+½. The switching between the different frequency division ratios is conducted at a specific timing, e.g., immediately after P77 goes Low.

Figure 19:
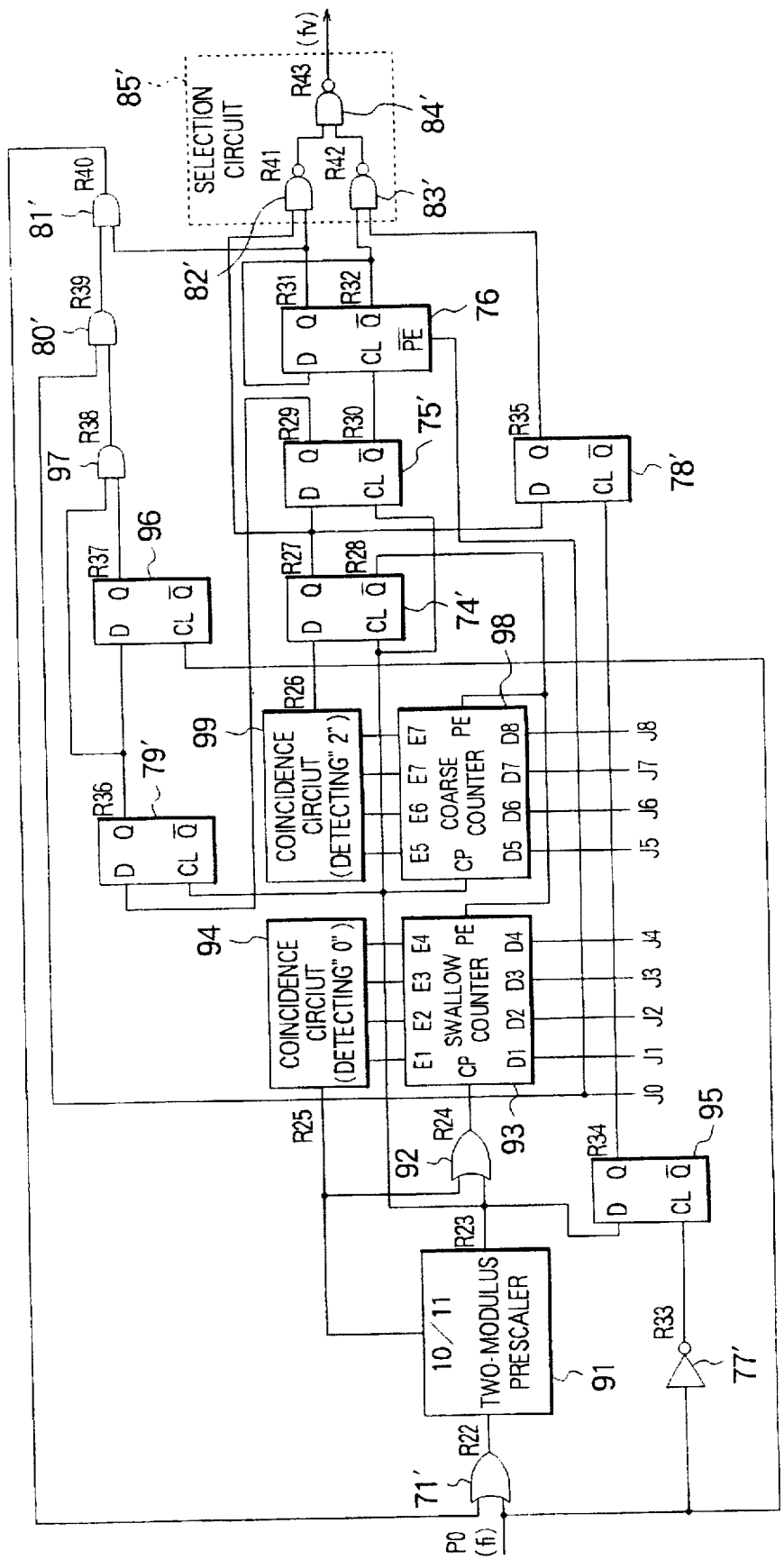
FIG. 19 is a block diagram showing the configuration of a variable frequency divider of a further embodiment.

Another embodiment, which is a pulse-swallow type frequency divider adopting the embodiment of FIG. 16, will next be described with reference to FIG. 19. The members similar to those in FIG. 16 are denoted by identical reference numerals with a prime, and their description is omitted.

The variable frequency divider is supplied with a signal J0 indicating whether or not ½ frequency division is to be performed, signals J1 to J4 designating a preset value P1 for the swallow counter 93, signals J5 to J8 designating a preset value P2 for the coarse counter 98, and an input signal P0 (fi). Each of J0 to J8 is a binary signal having a value 0 (Low) or 1 (High), and P0 is a pulse signal having equal High and Low intervals.

A two-modulus prescaler 91 receives the input signal P0 and performs frequency division by a frequency division ratio "10" or "11" depending on whether a signal R25, later described, is High or Low, and outputs the frequency-divided signal. An OR gate 92 outputs a signal R24 which is a logical sum of R23 and R25.

The swallow counter 93 takes the value P1 set by J1 to J4 as an initial value, and counts down R24 from the initial value. The coincidence circuit 94 (detecting "0") outputs a signal R25 which goes High when the value of the swallow counter 93 becomes "0." The coarse counter 98 takes the value P2 set by J5 to J8 and counts down R23 from the initial value. The coincidence circuit 99 (detecting "2") outputs a signal R26 which goes High when the value of the coarse counter 99 becomes "2."

The signal R23 is input as clock pulses to the D flip-flop 74', and its inverted output R28 is input to the PE terminals of the coarse counter 98 and the swallow counter 93.

An inverter 77' outputs an inversion R33 of P0. A D flip-flop 95 receives R33 as clock pulses, and takes R23 as an input. The output R34 of the D flip-flop 95 is supplied as clock pulses to a D flip-flop 78'. For this reason: (1) the output R35 of the D flip-flop 78' is delayed with respect to the output R27 of the D flip-flop 74' by half a period of P0.

The High time of the signal R36, which corresponds to the signal P72 in FIG. 16, is 10 or 11 times longer than P0. By delaying R36 by one period of P0 at the D flip-flop 96 receiving P0 as a clock, and inputting the resulting R37 together with R36 to an AND gate 97, a signal R38 having a High time identical to one period of P0 is obtained. This signal R38 is applied to the OR gate 71'. Accordingly, (2) when R40 goes High, two pulses of P0 are merged into one, and the resultant signal R23 will have pulses one less than P0 when R32 is High.

Because of the above configuration, when the swallow counter 93 counts down, and its content becomes "0," the two-modulus prescaler 91 changes its state from frequency division by 11 to frequency division by 10. That is, (3) the frequency division by 11 is repeated the number of times given by the preset value for the swallow counter 93.

Because R24 is kept High, frequency division by 10 is continued until preset by R28, which goes High at a frequency division cycle of the coarse counter 98. For this reason, (4) the frequency division by 10 is repeated the number of time given by subtracting the preset value for the swallow counter 93 from the preset value for the coarse counter 98.

From (1), (2), (3) and (4) above, frequency division ratio of the overall circuit is M×P2+P1+½ when J0 is "1," and is M×P2+P1 when J0 is "0."

As has been described, the embodiment of FIG. 16 can also be adopted to a pulse swallow system. That is, in a pulse swallow system, M×P2+P1 frequency divided signal and M×P2+P1+1 frequency divided output are alternately output by deletion of the pulses as in FIG. 16, on the basis of the output R26 from the coincidence circuit 99 associated with the coarse counter 98, and a signal R27 in synchronism with R26, and a signal R35 identical to R26 but delayed by half a period of the input signal P0 are alternately output, so as to achieve M×P2+P1+½ frequency division.

Figure 20:
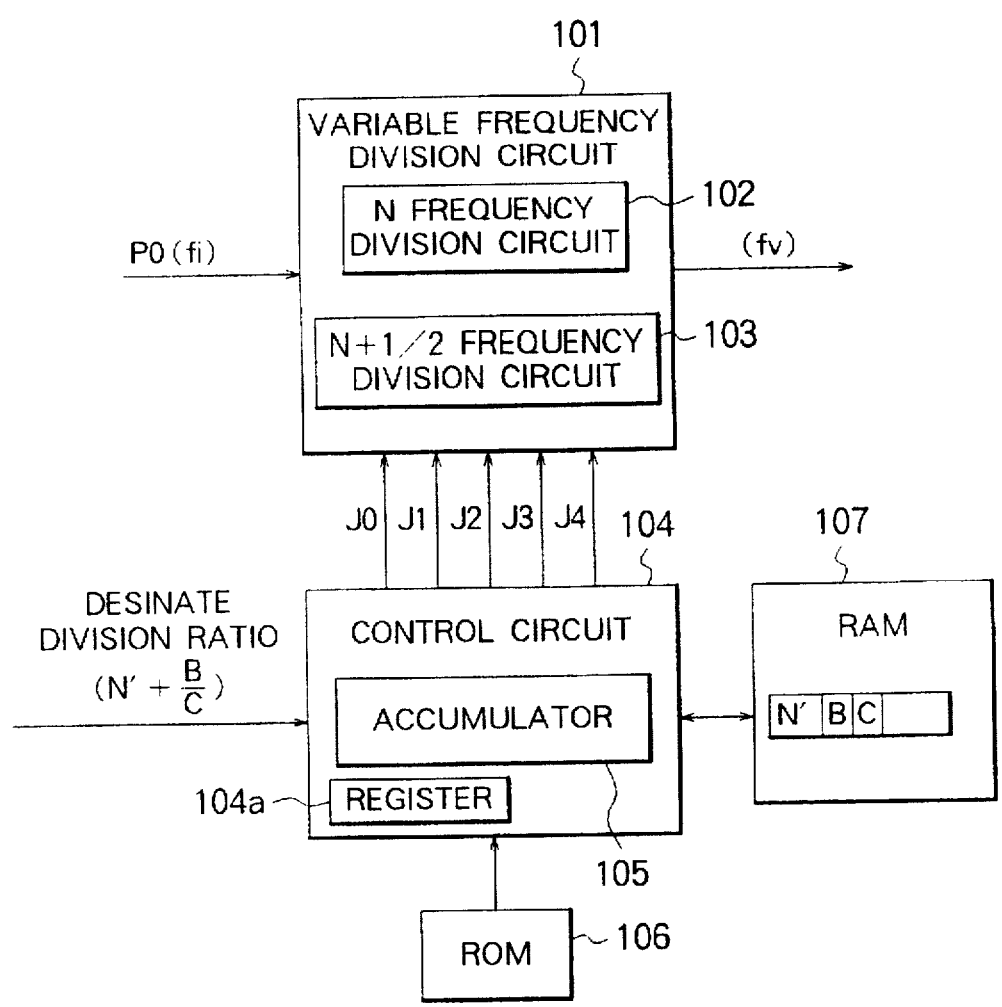
FIG. 20 is a block diagram showing the configuration of a fractional frequency divider of a further embodiment.

FIG. 20 shows a fraction frequency division circuit which is a further embodiment of the invention capable of frequency division by a mixed fractional frequency division ratio N'+B/C. A variable frequency division circuit 101 comprises an N frequency division circuit 102 and an N+½ frequency division circuit 103.

In FIG. 20, the N frequency division circuit 102 and the N+½ frequency division circuit 103 are shown to be separate. But this is for the sake of convenience of illustration. In implementing the invention, a circuit whose frequency division ratio can be selectively changed between N and N+½ can be used. The circuit shown in FIG. 4, FIG. 9 or FIG. 16 may be used as such a variable frequency division circuit. As an alternative, separate circuits may be provided for the N frequency division circuit 102 and the N+½ frequency division circuit 103, and they may be made to operate selectively under control of a control circuit. In such a case, the circuit shown in FIG. 1 may be used for the N+½ frequency division circuit 103.

The control circuit 104 includes an accumulator 105 for storing data obtained by addition or accumulation, and controls the variable frequency division circuit 101 on the basis of a frequency division ratio N'+B/C designated from outside of the illustrated circuit. A ROM 106 stores a program necessary for the operation of the control circuit 104. A RAM 107 stores data necessary for the operation of the control circuit 104.

The control circuit 104 receives signals designating N', B and C (determining the frequency division ratio) from outside, and operates in accordance with the program stored in the ROM 106, and controls the variable frequency division circuit 101 by means of the signals output via terminals J0 to J4.

When the signals from the terminals J1 to J4 indicate m (a positive number) and the signal from the terminal J0 is "0," the variable frequency division circuit 101 performs frequency division by m. When the signals from the terminals J1 to J4 indicate m (a positive number) and the signal from the terminal J0 is "1," the variable frequency division circuit 101 performs frequency division by m+½.

In order to perform the N'+B/C frequency division, the control circuit 104 sets the value of m to be N' or N'+1, and the signal at J0 to be "0" or "1," as will be later described in detail.

Figure 21:
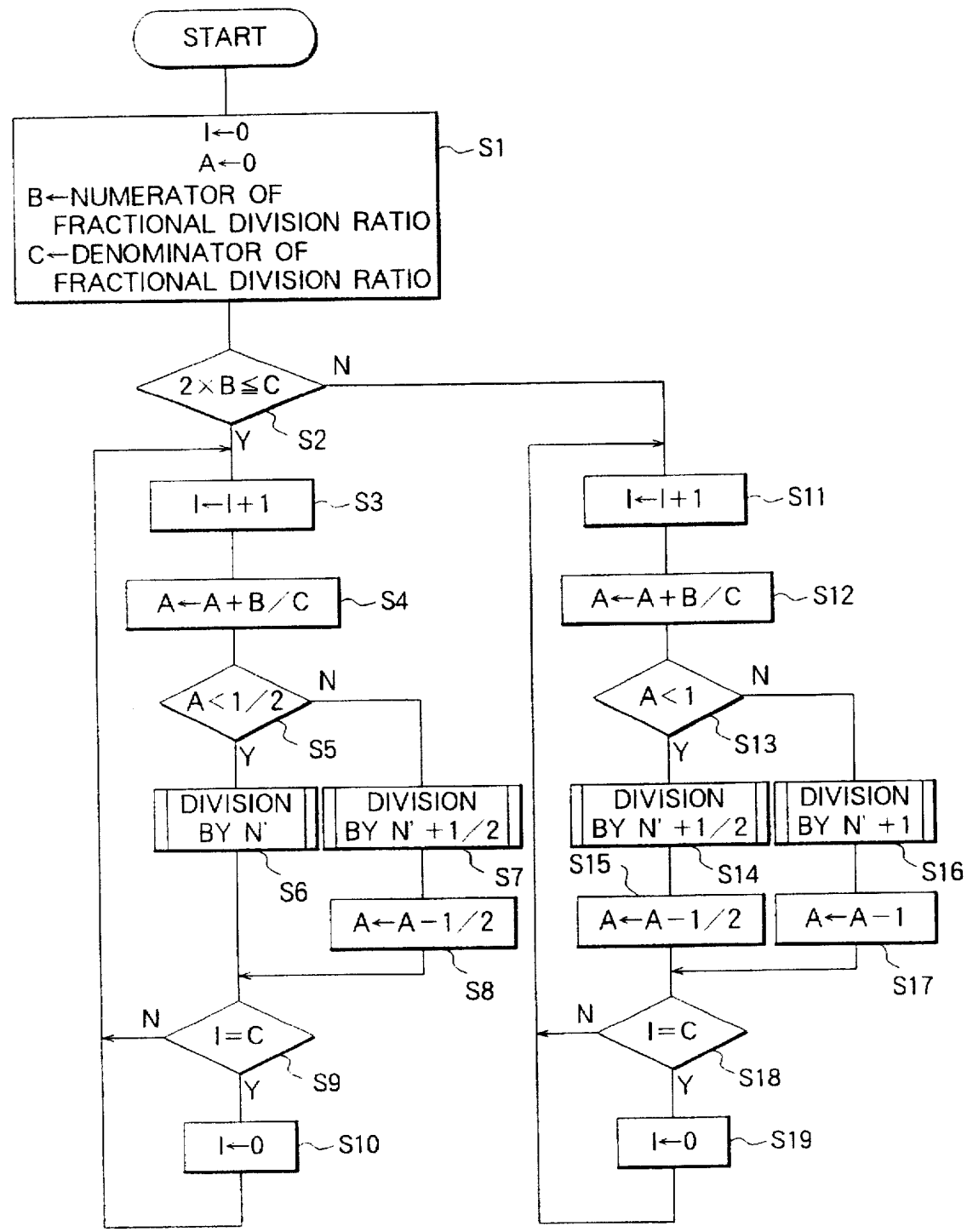
FIG. 21 is a flowchart showing an example of operation of the control circuit in the embodiment of FIG. 20.

The operation of the fraction frequency division of this embodiment will next be described. FIG. 21 is a flowchart showing the operation of the control circuit 104. A variable I is for counting the number of times frequency division is conducted, and is stored in a register 104a in the control circuit 104. A variable A is the variable stored in the accumulator 105, and represents an error. Variables B and C are numerator and denominator of the proper fractional part of the mixed fractional frequency division ratio, and are stored in the RAM 107.

When the frequency division ratio N'+B/C is designated, the variable I of the control circuit 104 is set to be "0," and the variable A is set to be "0," and the variables B and C of the numerator and denominator of the proper fractional part of the mixed fractional frequency division ratio are stored (S1). Then, judgment is made as to whether or not the numerator multiplied by 2 is not larger than the denominator C, i.e., whether 2×B≦C (S2). That is, whether N'+1 frequency division is required is judged.

If 2×B≦C ("Yes" at S2), then the variable I is incremented by 1 (S3). Next, the error corresponding to B/C frequency division is added to the variable A (S4). This error corresponding to B/C frequency division is the error that would result if N' frequency division is conducted. Next, judgment is made whether the resultant variable A is smaller than ½ (S5). If the variable A is smaller than ½, N' frequency division is conducted (S6), and the procedure proceeds to S9.

If at the step S5, the variable A is not smaller than ½, N'+½ frequency division is conducted (S7) and ½ is subtracted from the variable A (S8), and the procedure proceeds to step S9.

If the accumulator 105 is so set as to overflow at ½, the ½ subtraction is automatically conducted. But, in this case, the value A after the step S4 is the value after the ½ subtraction, so the judgment at step S5 is as to whether or not such an overflow has occurred.

At step S9, judgment is made whether or not the variable has become equal to C. That is, whether or not one cycle of frequency division is completed is examined. If I has not become C, the procedure returns to step S3, and the frequency division is conducted. If the variable I has become equal to C at step S9, the variable I is returned to 0 (S10), and the procedure returns to step S3.

If 2×B≦C at step S2, the variable I is incremented by "1" (S11). Then, B/C is added to the variable A (S12). Then judgment is made whether the resultant variable A is smaller than 1 (S13). If the variable A is smaller than 1, N'+½ frequency division is conducted (S14), and ½ is subtracted from the variable A (S15), and the procedure proceeds to step S18. If the variable A is not smaller than "1" at step S13, N'+1 frequency division is conducted (S16), and "1" is subtracted from the variable A (S17), and the procedure proceeds to step S18. At step S18, judgment is made whether or not the variable I has reached C. That is, whether or not one cycle of frequency division is completed is examined. If the variable has become equal to C, the procedure returns to step S11, and the next frequency division is conducted. If the variable I has become equal to C, the variable I is returned to "0" (S19), and the procedure returns to step S11.

It will next be described that the average frequency division ratio over one cycle (C times of the frequency division) will be N'+B/C, through the operation described above. First, let us assume that 2×B≦C (S3 to S10).

(1) The initial value of A is 0, and B/C added to A is 0 ≦B/C≦½, and ½ is subtracted from A when A≧½, so that the value of A (error) immediately before step S9 is 0≦A<½.

(2) The sum of the values added to A at S4 during C times of frequency division is (B/C)×C=B, which is an integer. On the other hand, the sum of the values subtracted from A at S8 is a multiple of ½. The difference between the sum of the values added and the sum of the values subtracted is the value of A immediately before step S9 when the C times of frequency divisions is completed, and is also a multiple of ½.

(3) The only value of A which satisfies both the conditions (1) and (2) is "0."

Accordingly, it can be said that the value of A immediately before step S9 after the C times of frequency division is 0. In this way, B is added to the value A during C times of frequency division, and the average frequency division ratio is N'+B/C.

When 2×B>C (S11 to S19), the concept is the same but there is a ½ shift compared with the case for 2×B≦C. The average is N'+B/C. That is, (4) The initial value of A is 0, and B/C added to A is ½<B/C<1, and 1 is subtracted from A when A≧1, so that the value of A (error) immediately before step S18 is 0≦A <½.

(5) The sum of the values added to A at s4 during C times of frequency division is (B/C)×C=B, which is an integer. On the other hand, the sum of the values subtracted from A at S8 is a multiple of ½. The difference between the sum of the values added and the sum of the values subtracted is the value of A immediately before step S18 when the C times of frequency division is completed, and is also a multiple of ½.

(6) The only value of A which satisfies both the conditions (4) and (5) is "0."

Accordingly, it can be said that the value of A immediately before step S18 after the C times of frequency division is 0. In this way, B is added to the value A during C times of frequency division, the average frequency division ratio is N'+B/C.

In this way, immediately before the error exceeds ½ or 1, the error is reduced by N'+½ frequency division or N'+1 frequency division. This method can be implemented by a simple configuration using an accumulator 105.

Figure 22:
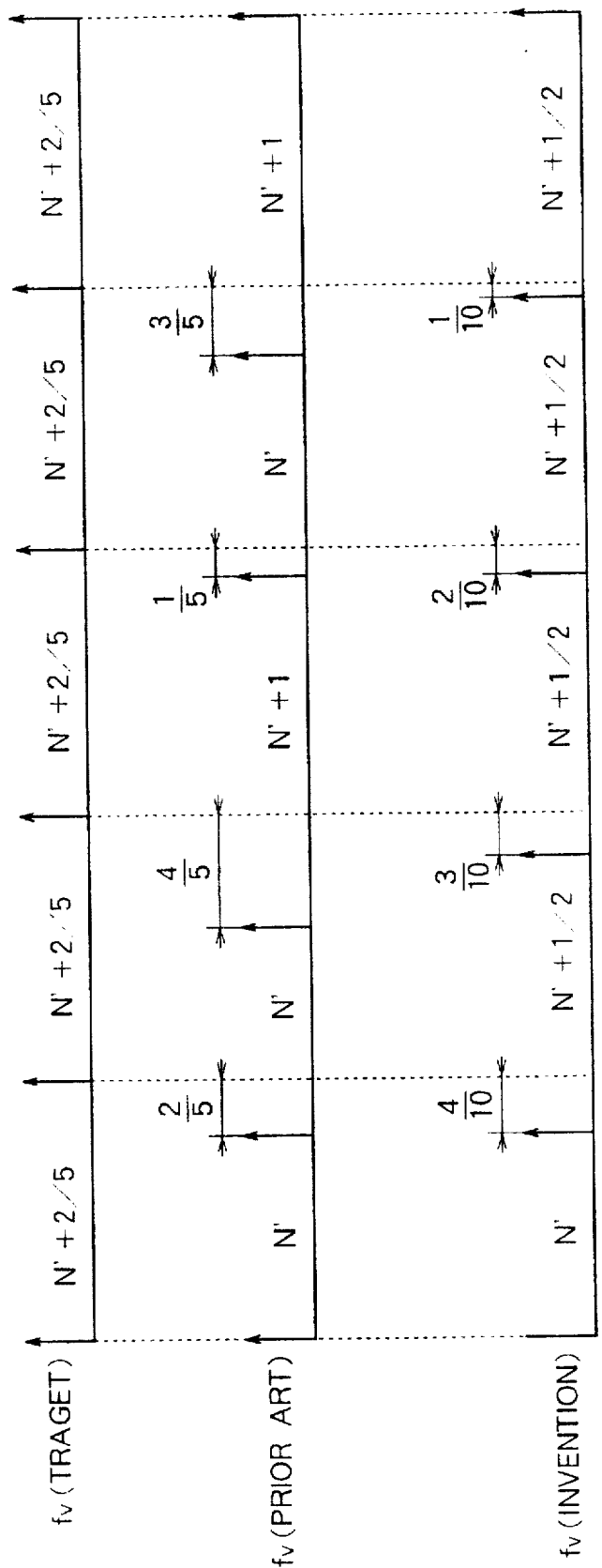
FIG. 22 is a time chart showing N'+⅔ frequency division by the operation of FIG. 21.
Figure 24:
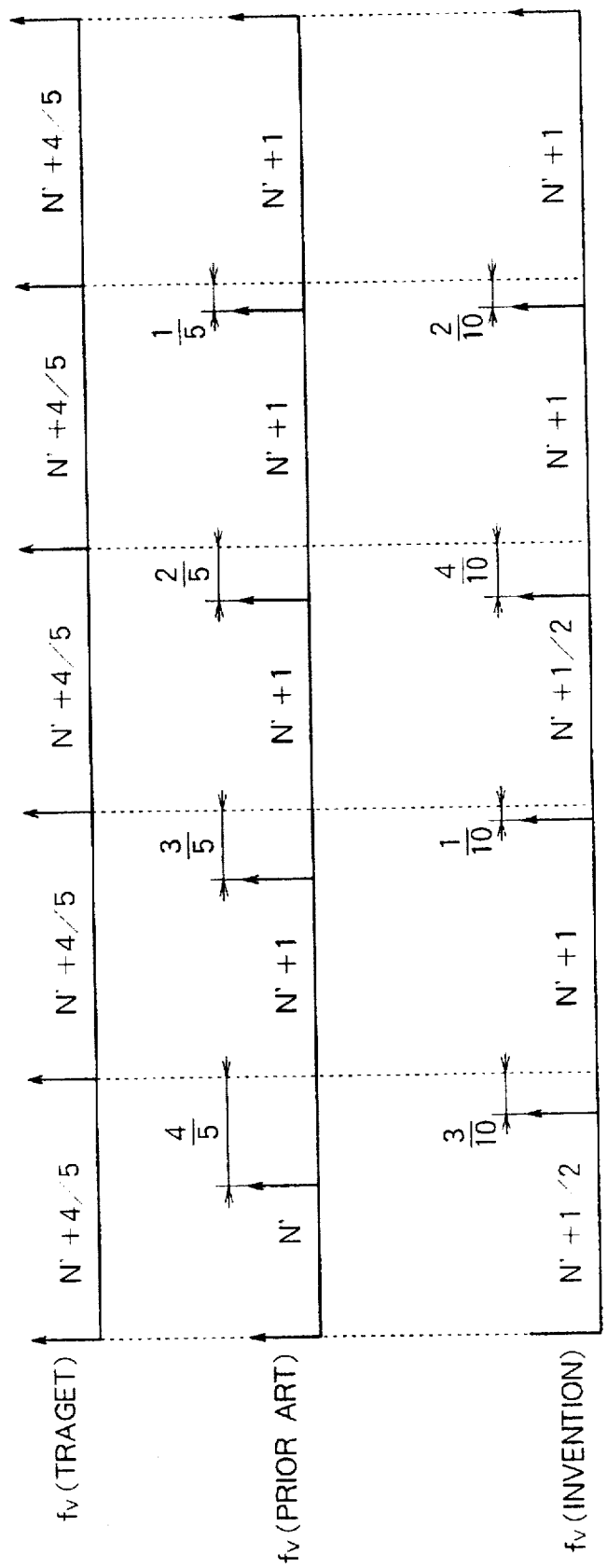
FIG. 24 is a time chart showing N'+⅘ frequency division by the operation of FIG. 21.

FIG. 22 is time chart showing the operation for N'+⅔ frequency division, as implemented by the above embodiment and a prior art which achieves the N'+⅔ frequency division by combination of N frequency division circuit and N+1 frequency division circuit, for the purpose of comparison. FIG. 23 shows the operation and associated errors in the form of a table. FIG. 24 is a time chart similar to FIG. 22, but the frequency division ratio is N'+⅘. As will be apparent from FIG. 22 to FIG. 24, the width of variation of errors, i.e., the width of variation of the phase according to the embodiment is about one half that of the prior art.

Figure 25:
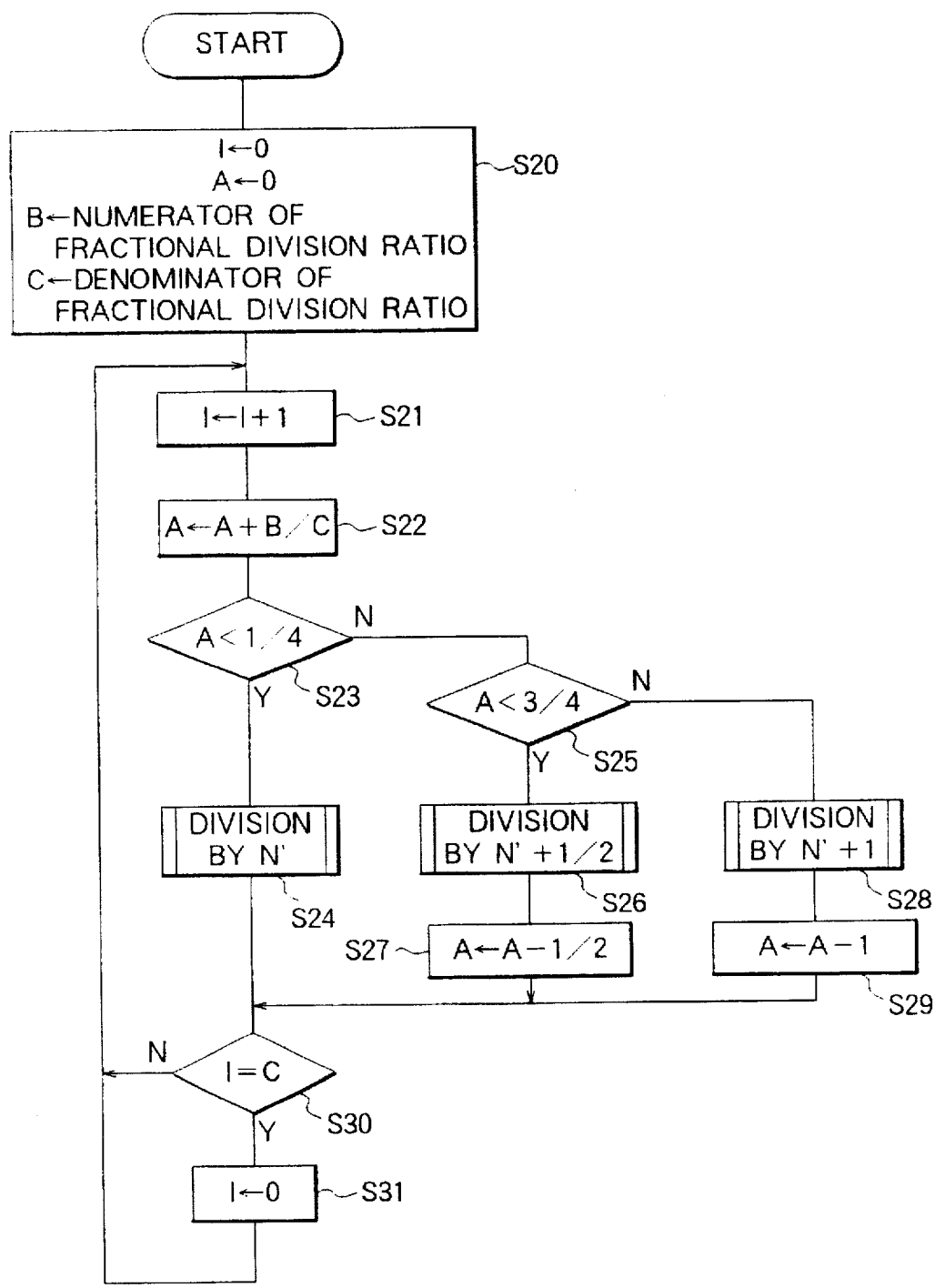
FIG. 25 is a flowchart showing another example of operation of the control circuit in the embodiment of FIG. 20.

Another example of operation of the control circuit 104 will next be described with reference to FIG. 25. The operation of the control circuit of this example is used, the error is smaller than with the operation of FIG. 21

When the frequency division ratio N'+B/C is designated, the control circuit 104 sets the variable I to be "0," the variable A to be "0," and causes the variables B and C to be stored as numerator and denominator of a proper fractional part of the mixed fractional frequency division ratio (S20). Then, "1" is added to the variable I (S21). Next, B/C is added to the variable A (S22).

Judgment is made whether the resultant variable A is smaller than ¼ (S23). If the variable A is smaller than ¼, N' frequency division is conducted (S24), and the procedure proceeds to step S30. If the variable A is not smaller than ¼ at step S22, then judgment is made whether the variable is smaller than ¾ (S25). If the variable A is smaller than ¾, N'+½ frequency division is conducted (S26), and ½ is subtracted from the variable A (S27), and the procedure then proceeds to step S30. If the variable A is not smaller than ¾, N'+1 frequency division is conducted (S28), and 1 is subtracted from the variable A (S29), and the procedure then proceeds to step S30.

At step S30, judgment is made whether the variable I has reached C. That is whether one cycle of frequency division has been completed is examined. If the variable I has not reached C, the procedure proceeds to step S21, and the next frequency division is conducted. If the variable I has reached C at step S30, the variable I is returned to 0 (S31), and the procedure proceeds to step S21.

In this way, which of the N' frequency division, N'+½ frequency division and N'+1 frequency division would result in the minimum error is calculated in advance, and frequency division which will result in the minimum error is conducted.

It will next be explained why the average frequency division ratio over one cycle (C times of frequency division) will be N'+B/C by the above operation.

The initial value of the variable A is "0," and if A <¼ at S23, no subtraction is conducted at the succeeding steps before returning to step S21. If ¼≦A<¾ at steps S23 and S25, ½ is subtracted at step S27, before returning to S21. If ¾≦A (in the first execution of the loop, ¾≦A<1), "1" is subtracted at step S29, before returning to S21. Accordingly, the value of A immediately before step S28 at the time of completion of the first execution of the loop, -¼≦A<¼. The above consideration will also applies to the second or subsequent execution of the loop, except that ¾≦A<¾ immediately before S28, so that the value of A immediately before S21 is -¼A≦¼ after the completion of the second execution of the loop. Taking these as conditions, and taking account of the fact that 0<_B/C<1, the value of A immediately before S23 is -¼≦A<¾ in the first as well as subsequent execution of the loop. If the conditions at S23 and S24 are also taken account of, then:

at points immediately before and immediately after S24 is -¼≦A<¼;

at a point immediately before S26 is ¼≦A<¾;

at a point immediately before S28 is ¾≦A<⁵⁄₄;

at a point immediately after S27 is -¼≦A<¼; and at a point immediately after S29 is -¼≦A<¼.

Accordingly the value of variable A immediately before S30 is -¼≦A<¼ in all situations.

The sum of the values added to the variable A at step S22 while C times of frequency division is conducted is B/C× C=B (integer), and the sum of the values subtracted at S27 and S29 is a multiple of ½, and the difference between the sum of the values added and the sum of the values subtracted is also a multiple of ½. The only variable A which satisfy all these conditions is "0." That is, the error after every C times of frequency division is 0, and the average of the frequency division is N'+B/C.

Figure 26:
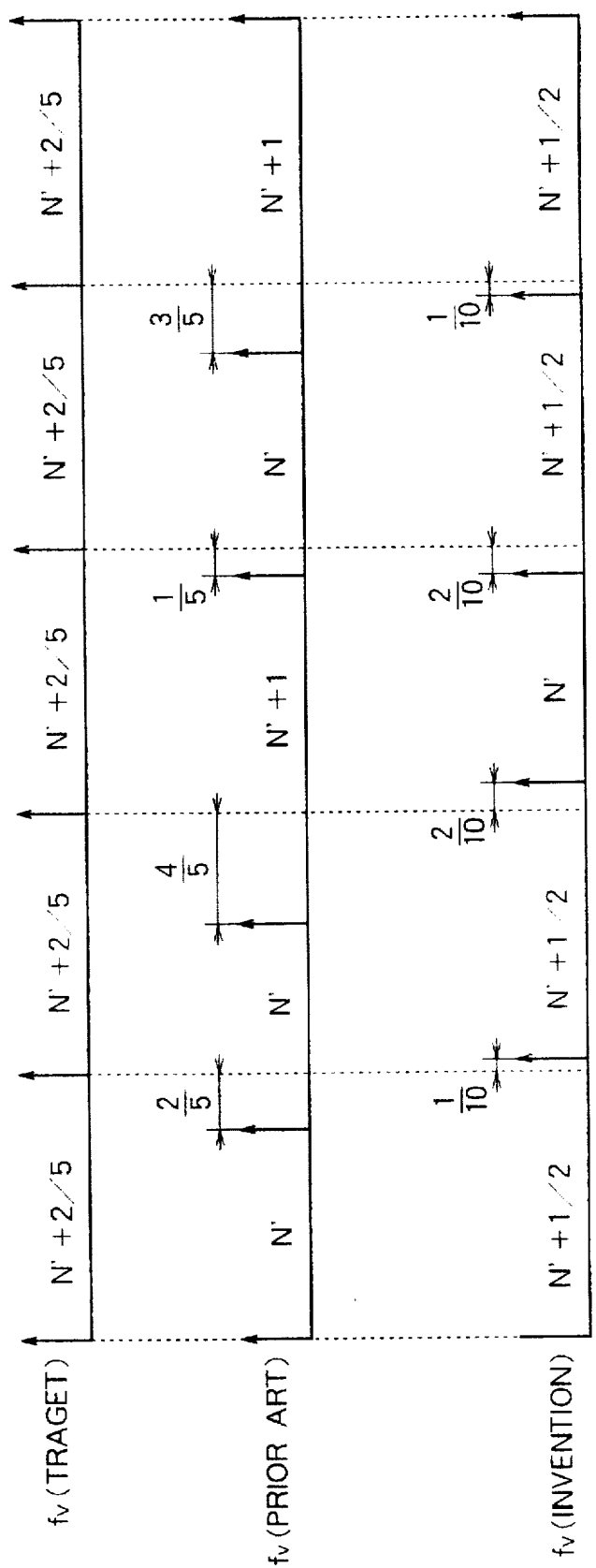
FIG. 26 is a time chart showing N+⅔ frequency division by the operation of FIG. 25.

FIG. 26 is a time chart showing the operation for N'+⅔ frequency division, as implemented by the above embodiment and a prior art which achieves the N'+⅔ frequency division by combination of N frequency division circuit and N+1 frequency division circuit, for the purpose of comparison. As will be apparent from FIG. 26, the width of variation of errors, i.e., the width of variation of the phase according to the embodiment is not more than half that of the prior art.

The N+½ frequency division in the above embodiment can be achieved by the circuit of FIG. 1, FIG. 4, FIG. 9 or FIG. 16, or still alternatively the method in which count down is alternately switched between the rising edges and falling edges, as shown in Japanese Utility Model Kokoku Publication No. 30352/1987.

21

Figure 27:
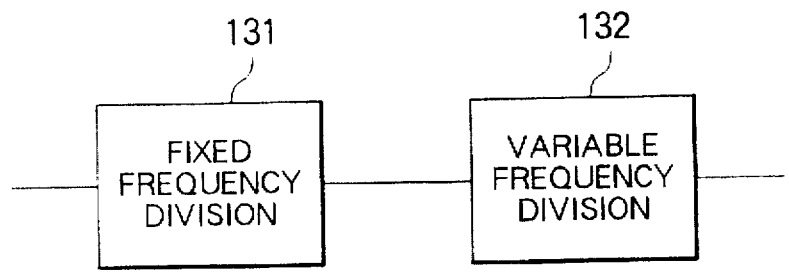
FIG. 27 is a block diagram showing the variable frequency divider of a further embodiment of the invention.

FIG. 27 shows a further embodiment of the invention.

The variable frequency divider of this embodiment comprises a fixed frequency division circuit 131 by a frequency division ratio P and a variable frequency division circuit 132 having a frequency division ratio N/P cascaded with each other. As the variable frequency division circuit 132, the variable frequency divider shown in FIG. 1, FIG. 4, FIG. 9, FIG. 13, FIG. 16 or FIG. 20 may be used. The fixed frequency division 131 performs frequency division by a frequency division ratio which equals to the denominator of a fraction representing a frequency division ratio of the variable frequency division circuit 132. For instance, if the frequency division ratio of the variable frequency division circuit 132 is N/2 as was the case of the circuit shown in FIG. 1, the frequency division ratio of the fixed frequency division circuit 132 is "2."

The combination of the fixed and variable frequency division circuits 131 and 132 shown in FIG. 27 may be used as the fixed frequency divider 25 and the variable frequency divider 21 forming the PLL in FIG. 7.

Figure 28A:
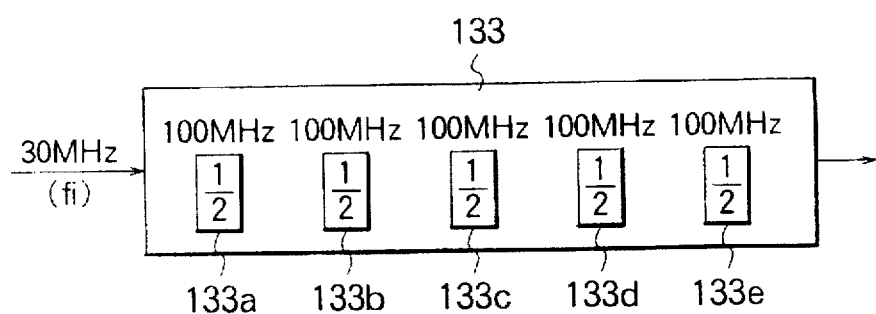
FIG. 28A is a block diagram showing a conventional variable frequency divider.
Figure 28B:
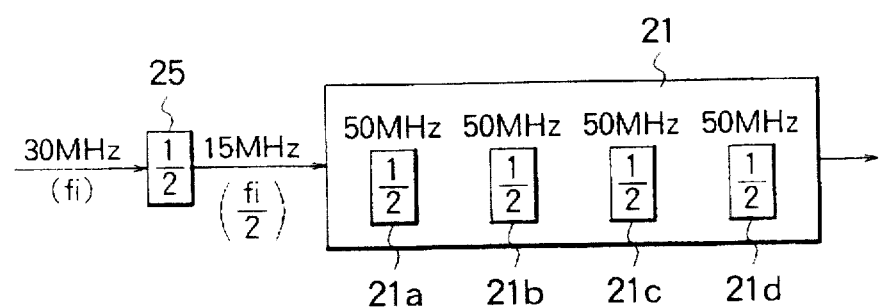
FIG. 28B is a block diagram showing a variable frequency divider of a further embodiment of the invention.

An example of the combination of the circuits shown in FIG. 27 is shown in FIG. 28B, in which the same reference numerals are used to denote the fixed and variable frequency dividers as in FIG. 7. FIG. 28A shows a prior art example having the same frequency division ratio as the variable frequency division circuit shown in FIG. 28B. The variable frequency divider 21 in FIG. 28B may be similar to that in FIG. 1, and comprises cascaded division elements 21a to 21d each having a frequency division ratio "2," and formed of a T-FF, for example. An equivalent prior art variable frequency divider 133 require five division elements 133a to 133e each having a frequency division ratio "2."

Next, the power saving effect will be explained. The operating speed efficiency of the cascaded division elements 21a to 21d, 133a to 133e is 20 to 30% with respect to the input frequency, because of the time delay for the feedback of the preset signal. If the frequency fo of output of the VCO is 30 MHz, and the operating speed efficiency is 30%, the five division elements 133a to 133e in FIG. 28A need to have the ability to operate at 100 MHz. On the other hand, the fixed frequency divider 25 is not associated with the feedback, so it is only required to have an ability of operating at 15 MHz. The input of the variable frequency divider 21 is the output of the fixed frequency divider 25, which is at 15 MHz, so that the four division elements 21a to 21d are required to have an ability of operating 50 MHz.

Thus, by employing the configuration in which a fixed frequency divider and a variable frequency divider are cascaded, elements having a lower operating frequency may be used as the variable frequency division elements (21a to 21d). As a result, not only can the cost of the devise lowered, but also the power consumption is reduced. This is because the power consumption is larger with a higher operating frequency.

Next the effect of clock delay elongation will be described. As was described in Japanese Utility Model Kokoku Publication 31060/1984, a frequency extender circuit is proposed, in which, by delaying a signal for detecting the contents of a counter forming part of the frequency divider, and using this signal as a coincidence circuit (preset signal), the permissible propagation delay time can be elongated up to one period of the input signal. The longer permissible propagation delay time means that the circuit can be used with an input signal with a higher frequency.

The variable frequency divider shown in FIG. 1, FIG. 4, FIG. 9, FIG. 13, or FIG. 19 is of a frequency extender system in which the signal detecting the contents of the counter is

22 delayed. If any of these variable frequency divider is used as the variable frequency divider shown in FIG. 27, the input to the variable frequency divider is input to the fixed frequency divider 131. Accordingly, the permissible propagation delay time for the coincidence signal is elongated in proportion to the frequency division ratio of the fixed frequency divider. For instance, in the case of FIG. 28B, the frequency division ratio of the fixed frequency divider 25 is "2," so that the permissible propagation delay time of the coincidence signal is doubled.

When any of the variable frequency divider of described above, for example, that described with reference to FIG. 1, is used to form a PLL, there is the following problem.

Figure 29:
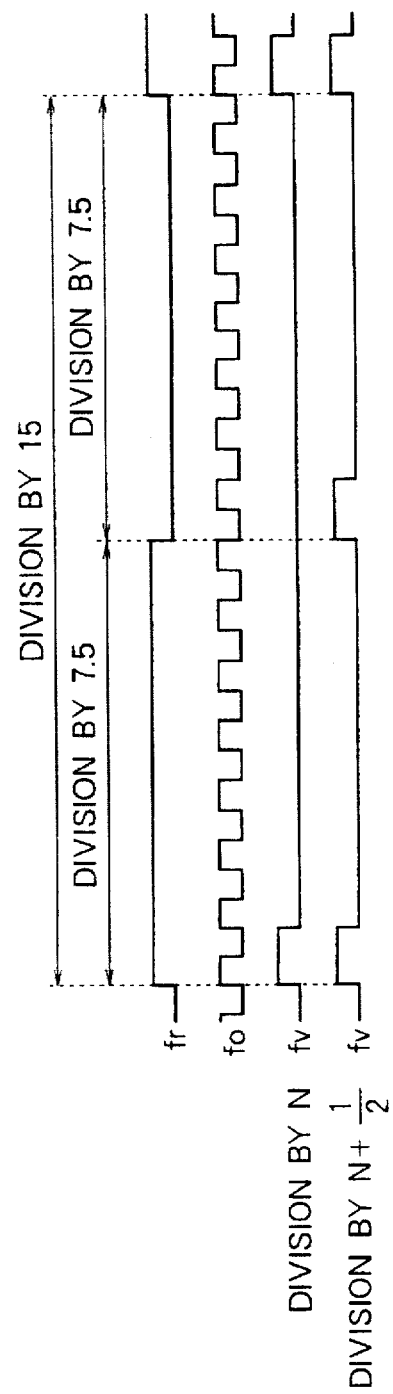
FIG. 29 is a diagram for explaining the operation of a PLL circuit incorporating the variable frequency divider of FIG. 1.

That is, the phase comparator 183 (FIG. 32) for comparing the phase of the output of the variable frequency divider with the signal of the reference frequency can operates either at the rising edges or the falling edges of the pulses. FIG. 29 shows the operation of the PLL circuit in which the variable frequency divider 182 produces output pulses whose rising edges are made to occur at specific timings. In the case of N+½ frequency division, if the odd-numbered output pulses (at the integer frequency-divided period position) of the variable frequency divider are made to coincide with the rising edges of the reference frequency fr, then the even-numbered pulses (at ½ frequency-divided period position) will coincide with the falling edges of the reference frequency fr. Accordingly, the phase cannot be compared at the even-numbered pulses.

Figure 30:
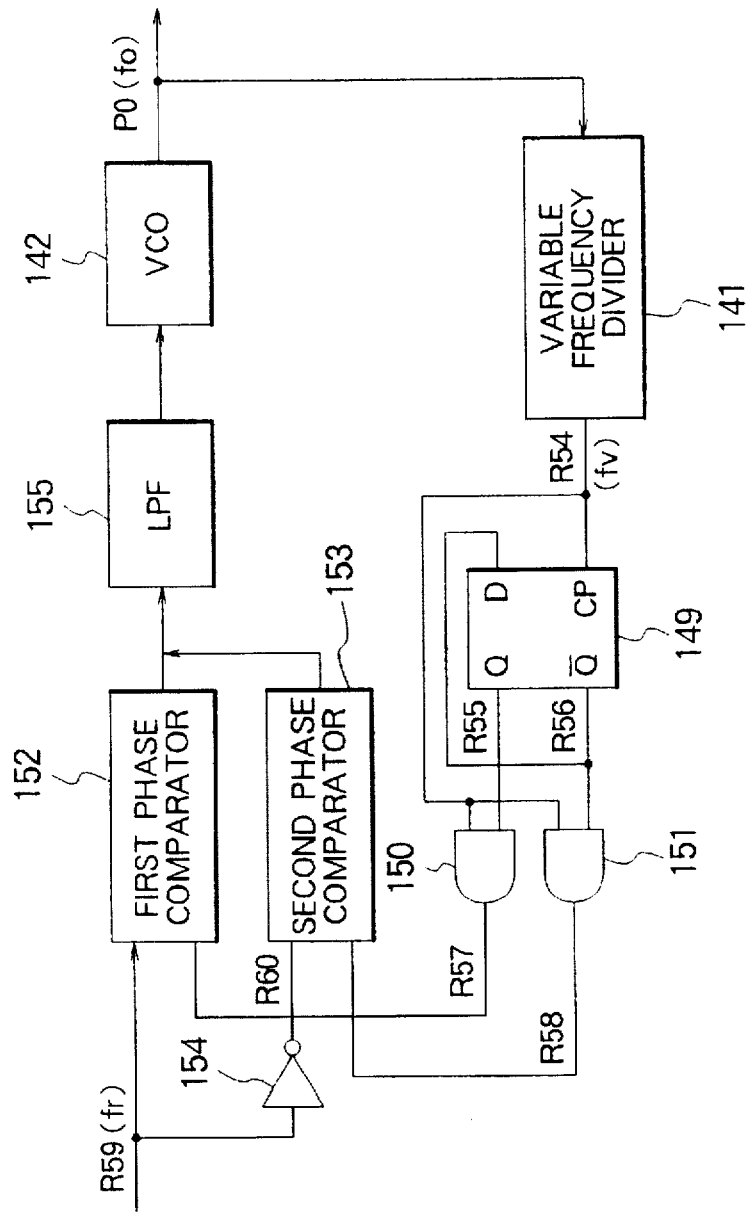
FIG. 30 is a block diagram showing the configuration of PLL circuit (including the variable frequency divider of FIG. 1) of a further embodiment of the invention.
Figure 31:
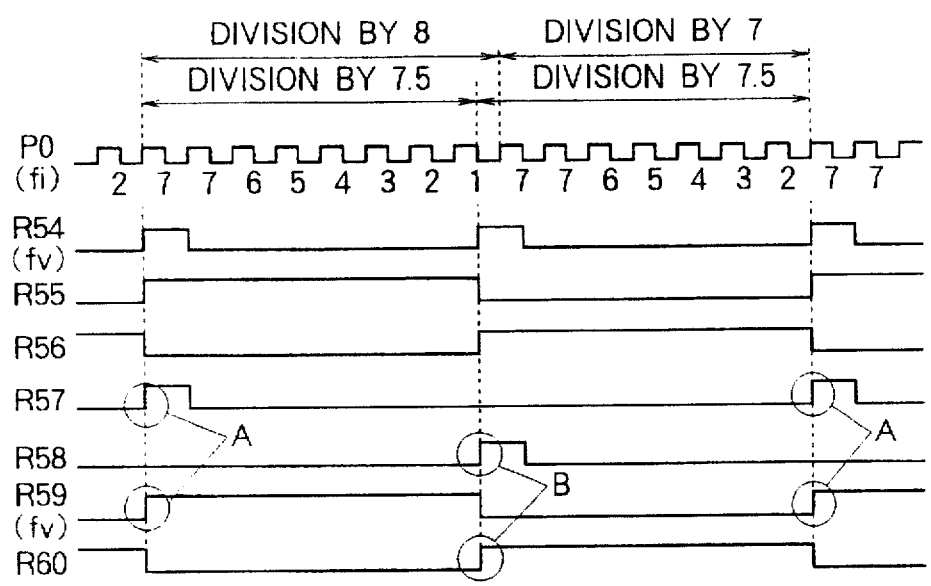
FIG. 31 is a diagram for explaining the operation of the PLL circuit of a further embodiment of the invention.

The embodiment to be described next is to solve the problem described above. FIG. 30 is a block diagram showing a general configuration of a PLL circuit of this embodiment, and FIG. 31 shows the operation of the PLL circuit shown in FIG. 30.

A variable frequency divider 141 frequency-divides the output signal P of the voltage-controlled oscillator (VC) 142 by a frequency division ratio N+½.

The operation of the variable frequency divider 141 is identical to that of the circuit shown in FIG. 1. and frequency-divides the signal P0 having a local oscillating frequency fo.

A D flip-flop 149 takes the output R54 (fv) of the variable frequency divider 141 as clock pulses, and its inverted output R56 is fed back to its input signal, and therefore provides signals R55 and R56 which switches from High to Low, or Low to High, in synchronism with the rising edges of R54.

An AND gate 150 receives R54 and R55, and outputs odd-numbered pulses R57 (at integer frequency-divided period positions) of R54 are output. Another AND gate 151 receives R54 and R56, and outputs even-numbered pulses R58 (at ½ frequency-divided period positions) of R54.

A first phase comparator 152 compares the phase of the signal R57 consisting of odd-numbered output pulses of the variable frequency divider 141 with the signal R59 having a reference frequency fr at the rising edges of the pulses. A second phase comparator 153 compares the phase of the signal R58 consisting of even-numbered output pulses of the variable frequency divider 141 with the inverted signal R60 of the reference frequency fr, inverted by the inverter 154, at the rising edges of the pulses.

A low-pass filter (LPF) 155 converts the outputs of the first and second phase comparators 152 and 153 into a control voltage, which is input to the voltage controlled oscillator 142.

The operation of the PLL circuit having the above configuration will next be described with reference to FIG. 31. The operation of the variable frequency divider 141 is the same as that described with reference to FIG. 3 in connection with the circuit of FIG. 1.

The outputs R55 and R56 of the D flip-flop 149 are repetitively switched between High and Low states in synchronism with the rising edges of R54. R57 is a logical product of R54 and R55, and consists of odd-numbered pulses of R54. R58 is a logical product of R54 and R56, and consists of even-numbered pulses of R54.

The first phase comparator 152 compares the phase of R57 with the signal R59 having the reference frequency fr. That is, it compares the positions (A) at the odd-numbered pulses of R54.

The second phase comparator 153 compares the phase of R58 with the inverted signal R60 having the reference frequency fr. That is, it compares the positions (B) at the even-numbered pulses of R54.

The outputs of the first and second phase comparator 152 and 153 are converted at the low-pass filter 155 into a control voltage, which is input to the voltage controlled oscillator 142.

In this way, N+½ frequency divider can be adopted to a PLL circuit having phase comparators which itself can compare the phase at the rising edges alone or the falling edges alone.

The variable frequency divider which can be used as a variable frequency divider capable of N+½ frequency division, in a PLL according to the above embodiment is not limited to the one shown in FIG. 1, but may be the one shown in FIG. 4, FIG. 9, FIG. 16, FIG. 20, FIG. 27 or FIG. 28. It may also be the one known in the art, such as the one disclosed in Japanese Patent Kokoku Publication No. 49,540/1976, in which the local oscillating frequency fo is inverted.

The counter of the programmable frequency divider in the variable frequency divider performing N+½ frequency division according to the invention can operate at the same speed as in the case of frequency division by N. Accordingly, it is not necessary to increase the operating speed of the programmable frequency divider, and yet the N+½ frequency division can be achieved. Moreover, it is possible to adopt the variable frequency divider to a pulse swallow system. Furthermore, the reference frequency may be twice that for the case where the frequency divider can perform N division, but N+½ division. As a result, the loop gain is improved, and the lock-up time can be shortened.

According to the embodiment described with reference to FIG. 20, the error can be reduced compared with a conventional fractional frequency divider which combine N division and N+1 division.

Furthermore, with the embodiment described with reference to FIG. 30, the variable frequency divider with a frequency division ratio N+½ can be adapted to a PLL circuit capable of comparison at the rising edges only or falling edges only.

What is claimed is:

1. A variable frequency divider comprising:
   a programmable frequency dividing means for frequency-dividing an input with frequency division ratios N (N being an integer) and N+1, alternately;
   a first signal generating means for generating a first signal in synchronism with an output signal of the programmable frequency dividing means;
   a second signal generating means for generating a second signal identical to said first signal but delayed by ½ period of said input signal; and
   an output means for alternately outputting said first and second signals.

2. The variable frequency divider according to claim 1, further comprising:
   a delay means for generating a delayed signal identical to said first signal but delayed by one period of said input signal; and
   a preset signal generating means for alternately selecting said delayed signal and said first signal, and presetting said programmable frequency dividing means by means of the selected signal.

3. The variable frequency divider according to claim 2, wherein said output means outputs said first signal in a mode for the frequency division ratio N, and alternately outputs said first and second signals in a mode for the frequency division ratio N+½.

4. The variable frequency divider according to claim 2, wherein said preset signal generating means outputs said first signal as a preset signal to said programmable frequency dividing means in a mode for the frequency division ratio N, and alternately selecting said first signal and said delayed signal and outputting the selected signal as the preset signal to said programmable frequency dividing means in a mode for a frequency division ratio N+½.

5. The variable frequency divider according to claim 1, wherein said programmable frequency dividing means outputs a frequency-divided signal by a frequency division ratio N in a mode for the frequency division ratio N, and alternately outputs a frequency-divided signal by the frequency-division ratio N and a frequency-divided signal by the frequency division ratio N+1 in a mode for the frequency division ratio N+½.

6. The variable frequency divider according to claim 1, wherein said programmable frequency dividing means presets a frequency-division ratio set value responsive to a preset signal.

7. The variable frequency divider according to claim 1, wherein said programmable frequency dividing means comprises:
   an adder means for alternately outputting set values for the frequency division ratio N and the frequency division N+1; and
   a programmable frequency divider for performing frequency division by a frequency division ratio set by the adder means.

8. The variable frequency divider according to claim 7, wherein
   said adder means outputs a set signal for the frequency division ratio N in the mode for the frequency division ratio N, and alternately outputs set signals for the frequency division ratio N and the frequency division ratio N+1 in the mode for the frequency division ratio N+½; and
   said output means outputs said first signal in the mode for the frequency division ratio N, and alternately outputs said first and second signals in the mode for the frequency division ratio N+½.

9. The variable frequency divider according to claim 1, wherein said programmable frequency dividing means comprises:
   a pulse deleting means for deleting one pulse out of every 2N+1 pulses of the input signal; and
   a programmable frequency divider receiving the input signal via said pulse deleting means, and outputting one frequency-divided pulse each time it receives N pulses through said pulse deleting means to alternately performs frequency division by the frequency division ratio N and frequency division by the frequency division ratio N+1.

10. The variable frequency divider according to claim 9, wherein said pulse deleting means deletes one pulse out of every 2N+1 pulses of the input signal in the mode for the frequency division ratio N+½, and passes the input signal without the deletion in the mode for the frequency division ratio N; and said output means alternately outputs said first signal and second signals in the mode for the frequency division ratio N+½;

whereby frequency division by the frequency division ratio N or frequency division by the frequency division ratio N+½ is performed on the basis of a set signal for the frequency division ratio.

11. A variable frequency divider comprising:

a two-modulus prescaler for frequency-dividing an input signal by a frequency division ratio M (M being an integer) or a frequency division ratio M+1;

a pulse swallow means having a coarse counter for causing said two-modulus prescaler to perform frequency division P2 times, and a swallow counter for causing said two-modulus prescaler to perform M+1 frequency division P1 times, out of P2 times, and thereby frequency-dividing the input signal by a frequency division ratio M×P2+P1;

a control means for causing cause said pulse swallow means to perform frequency division by M×P2'+P1' in a mode for a frequency division by N, and to alternately perform frequency division by M×P2'+P1' and frequency division by M×P2'+P1'+1 in a mode for a frequency division by N+½;

a first signal generating means for generating a first signal in synchronism with the output of said coarse counter;

a second signal generating means for generating a second signal identical to said first signal but delayed by a ½ period of said input signal; and an output means for outputting said first signal in the mode for the frequency division ratio N, and alternately outputting said first signal and said second signal in the mode for the frequency division ratio N+½.

12. The variable frequency divider according to claim 11, wherein said control means comprises an adder means for outputting set signals for a number of cycles P1 and a number of cycles P2 (P1 and P2 being integers);

said coarse counter causes said two-modulus prescaler to perform frequency division P2 times on the basis of the set signal from the adder means;

said swallow counter causes said two-modulus prescaler to perform frequency division P1 times, output P2 times, on the basis of the set signal from the adder means;

said adder means outputs the set signals for the number of cycles P1 and the number of cycles P2 in the mode for the frequency division ratio N, and alternately outputs the set signals for the number of cycles P1 and the number of cycles P2, and a number of cycles P1+1 and the number of cycles P2 with any carry resulting from the addition of P1+1 in the mode for the frequency division ratio N+½.

13. The variable frequency divider according to claim 11, wherein said control means outputs the pulses of the input signal, deleting one out of every 2×(M×P2+P1)+1 pulses of the input signal in the mode for the frequency division ratio N+½, and outputs the pulses without the deletion in the mode for the frequency division ratio N.

14. A variable frequency divider comprising:

a frequency-dividing means for performing frequency-division by a frequency-division ratio N or a frequency division ratio N+½, on the basis of a given integer N;

a control means responsive to a given integers N', B and C (N', B and C being integers, and B<C), for assigning the integer N' and another integer N'+1 to said frequency dividing means to cause said frequency dividing means to perform frequency division by a frequency division ratio N' or by a frequency division ratio N'+1, and/or by a frequency division ratio N'+½, such that an average of the frequency division ratio over C frequency-divided periods will be N'+B/C.

15. The variable frequency divider according to claim 14, wherein said control means includes an accumulator for adding a B/C to an accumulated error value A every frequency-divided period, subtracting ½ from the accumulated error value A each time frequency division the a frequency division ratio N'+½ is performed, and subtracting 1 from the accumulated error value A each time frequency division by the frequency division ratio N'+1 is performed;

when 2×B≦C, said control means causes said frequency dividing means to perform frequency division by the frequency division ratio N' when the accumulated value A immediately after the above-mentioned addition of B/C is smaller than ½, and causes said frequency dividing means to perform frequency division by the frequency division ratio N'+½ when the accumulated value A immediately after the above-mentioned addition of B/C is larger than ½; and when 2×B<C, said control means causes said frequency dividing means to perform frequency division by the frequency division ratio N'+½ when the accumulated value A immediately after the above-mentioned addition of B/C is smaller than 1, and causes said frequency dividing means to perform frequency division by the frequency division ratio N'+1 when the accumulated value A immediately after the above-mentioned addition of B/C is larger than 1.

16. A variable frequency dividing apparatus comprising:

a fixed frequency divider performing frequency division by a frequency division ratio P, on the basis of a given integer P; and a variable frequency divider for frequency-dividing an output of said fixed frequency divider by a frequency division ratio N/P, where N being a variable integer.

17. A PLL comprising:

a voltage controlled oscillator;

a variable frequency divider for frequency dividing an output of the voltage controlled oscillator by a frequency division ratio N+½ (N being an integer);

a separating means for separating output pulses from said variable frequency divider into odd-numbered pulses and even-numbered pulses;

a first phase comparator for comparing a phase of a reference signal with a phase of said odd-numbered pulses;

an inverter for inverting said reference signal;

a second phase comparator for comparing a phase of an output of said inverter and a phase of said even-numbered pulses; and a low-pass filter for converting outputs of said first and second phase comparators into a control voltage and applying the control voltage to said voltage-controlled oscillator.

\* \* \* \* \*